US012743986B2

(12) United States Patent
Kwon et al.

(10) Patent No.: US 12,743,986 B2
(45) Date of Patent: Sep. 22, 2026

(54) SOURCE AMPLIFIER AND SOURCE DRIVER INCLUDING SOURCE AMPLIFIER

(71) Applicant: SAMSUNG ELECTRONICS CO., LTD., Suwon-si (KR)

(72) Inventors: Taek Su Kwon, Suwon-si (KR); Suyun Chae, Daejeon (KR); In-Suk Kim, Suwon-si (KR); Hyun-Sik Kim, Daejeon (KR)

(73) Assignees: SAMSUNG ELECTRONICS CO., LTD., Suwon-si (KR); KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 19/328,647

(22) Filed: Sep. 15, 2025

(65) Prior Publication Data

US 2026/0120613 A1 Apr. 30, 2026

(30) Foreign Application Priority Data

Oct. 25, 2024 (KR) ........................ 10-2024-0147530

(51) Int. Cl.
*G09G 3/20* (2006.01)
*G09G 3/3275* (2016.01)
(Continued)

(52) U.S. Cl.
CPC ......... *G09G 3/2092* (2013.01); *G09G 3/3275* (2013.01); *H03F 3/213* (2013.01);
(Continued)

(58) Field of Classification Search
CPC ... G09G 2310/0291; G09G 2320/0673; G09G 3/3688; G09G 2310/027
See application file for complete search history.

(56) References Cited

U.S. PATENT DOCUMENTS 7,362,173 B1 4/2008 Knausz
7,786,801 B2 8/2010 Kim
(Continued)

FOREIGN PATENT DOCUMENTS

CN 109450382 A 3/2019
KR 10-1388221 B1 4/2014
(Continued)

*Primary Examiner* — Van N Chow
(74) *Attorney, Agent, or Firm* — Sughrue Mion, PLLC

(57) ABSTRACT

A source amplifier includes: an input circuit to receive an input signal from an input terminal and an output signal having a complementary relationship with the input signal, and output a first intermediate signal and a second intermediate signal, respectively, to a first intermediate node and a second intermediate node, based on the input signal and the output signal; an amplifier to amplify the first intermediate signal and the second intermediate signal, to output a third intermediate signal and a fourth intermediate signal; an output circuit configured to output the output signal, which is a data voltage, to an output terminal, based on the third intermediate signal and the fourth intermediate signal; a compensator including a first capacitor connected between the output terminal and the first intermediate node, and a second capacitor connected between the output terminal and the second intermediate node; and a feed-forward circuit.

20 Claims, 17 Drawing Sheets

(51) Int. Cl.
*H03F 3/213* (2006.01)
*H03F 3/217* (2006.01)
*H03F 3/45* (2006.01)
*G09G 3/36* (2006.01)

(52) U.S. Cl.
CPC ....... *H03F 3/2171* (2013.01); *H03F 3/45762* (2013.01); *G09G 3/3688* (2013.01); *G09G 2310/0291* (2013.01); *G09G 2320/0276* (2013.01); *G09G 2320/0673* (2013.01)

(56) References Cited

U.S. PATENT DOCUMENTS

| | | | | |
|---|---|---|---|---|
| 7,863,982 | B2 | 1/2011 | Chen et al. | |
| 8,081,150 | B2 | 12/2011 | An | |
| 9,959,810 | B2 | 5/2018 | Kim | |
| 11,271,582 | B2 | 3/2022 | Lee et al. | |
| 11,721,265 | B1 | 8/2023 | Ma et al. | |
| 11,736,079 | B2 | 8/2023 | Koh et al. | |
| 11,837,132 | B2 | 12/2023 | Lee et al. | |
| 11,936,372 | B2 | 3/2024 | Sul et al. | |
| 12,125,426 | B2 | 10/2024 | Ma et al. | |
| 2009/0066415 | A1* | 3/2009 | Kim | H03F 3/45219 330/253 |
| 2010/0013558 | A1 | 1/2010 | Chen et al. | |
| 2011/0063200 | A1* | 3/2011 | An | G09G 3/3688 345/98 |
| 2014/0253532 | A1* | 9/2014 | Woo | G09G 5/00 345/212 |
| 2016/0012765 | A1* | 1/2016 | Jeong | G09G 3/3685 345/212 |
| 2021/0264844 | A1* | 8/2021 | Kim | G06F 7/74 |
| 2023/0223935 | A1 | 7/2023 | Sul et al. | |
| 2024/0112612 | A1 | 4/2024 | Cheng et al. | |
| 2025/0095541 | A1* | 3/2025 | Kwon | G09G 3/2096 |
| 2026/0120613 | A1* | 4/2026 | Kwon | G09G 3/2092 |

FOREIGN PATENT DOCUMENTS

| | | | |
|---|---|---|---|
| KR | 10-1903019 | B1 | 10/2018 |
| KR | 10-2021-0138847 | A | 11/2021 |
| KR | 10-2021-0142809 | A | 11/2021 |
| KR | 10-2022-0134850 | A | 10/2022 |
| KR | 10-2022-0143227 | A | 10/2022 |
| KR | 10-2023-0124162 | A | 8/2023 |

* cited by examiner

Figure 1:
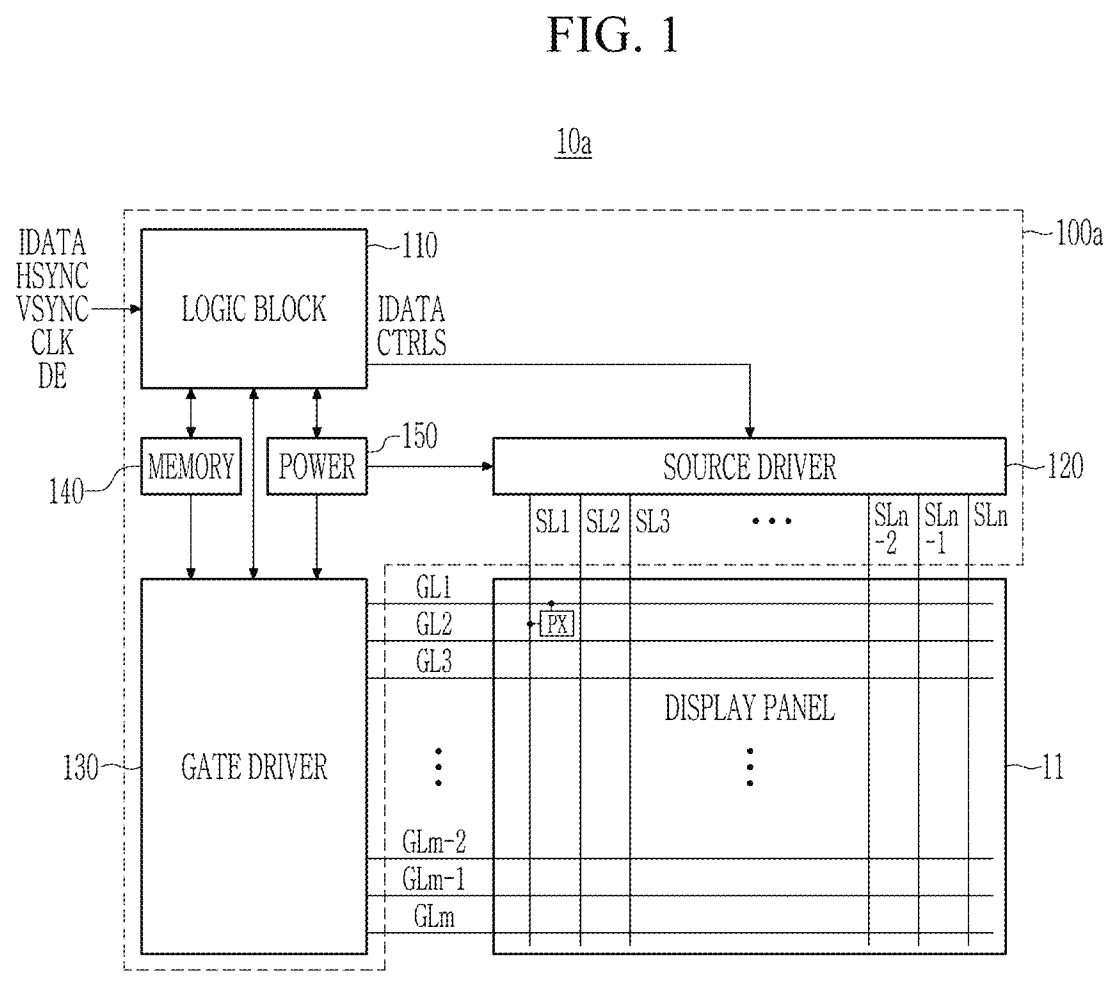

LOGIC BLOCK

SOURCE DRIVER

GATE DRIVER

DISPLAY PANEL

POWER

MEMORY

PX

IDATA HSYNC VSYNC CLK DE

IDATA CTRLS

SL1 SL2 SL3 SLn-2 SLn-1 SLn

GL1 GL2 GL3 GLm-2 GLm-1 GLm 110 120 130 140 150 11

FIG. 4

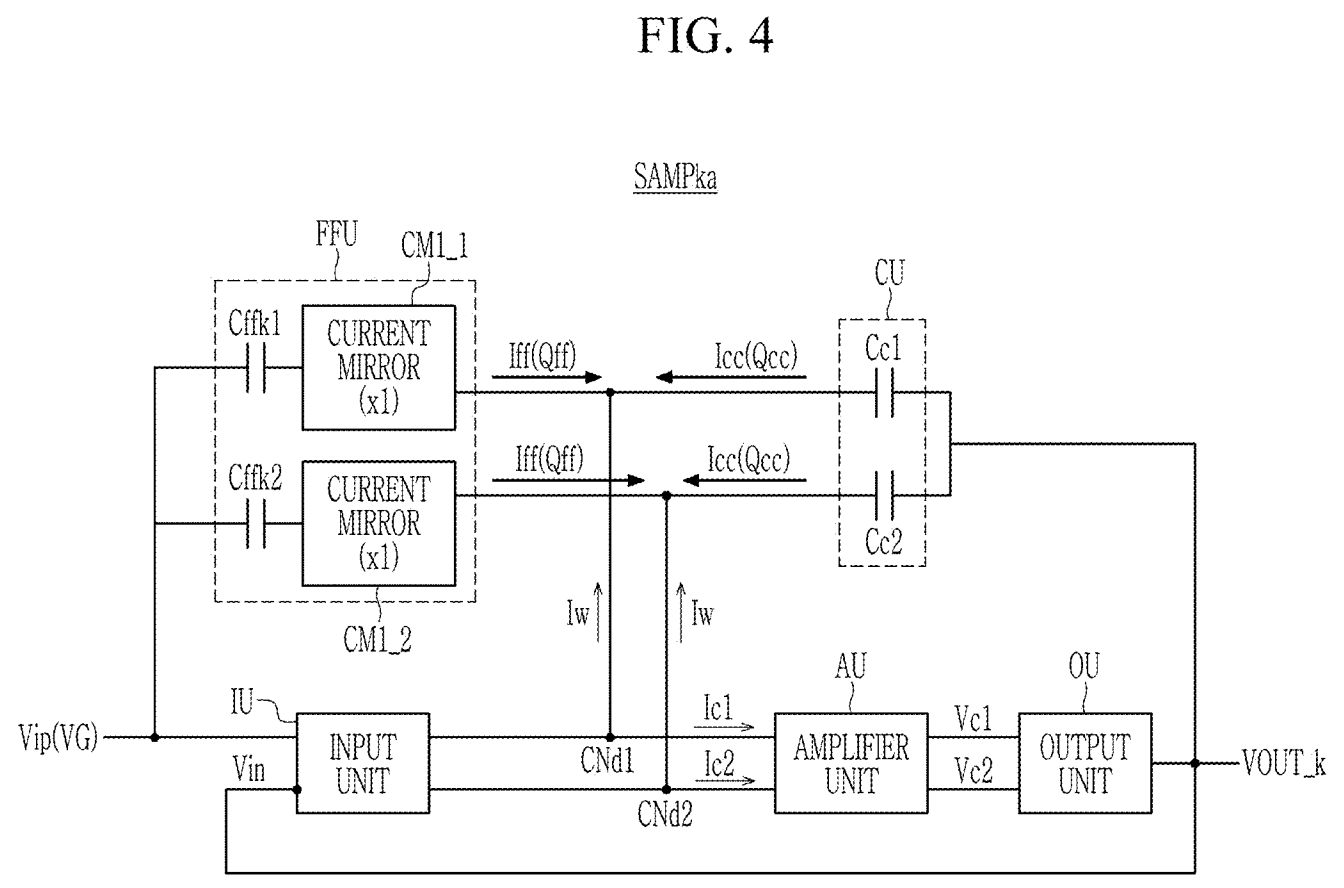

SAMPka

VOUT_k
OU
OUTPUT UNIT
Vc1
Vc2
AU
AMPLIFIER UNIT
CU
Cc1
Cc2
Icc(Qcc)
Icc(Qcc)
Iw
Iw
Ic1
Ic2
CNd1
CNd2
Iff(Qff)
Iff(Qff)
FFU
CM1_1
CM1_2
CURRENT MIRROR (x1)
CURRENT MIRROR (x1)
Cffk1
Cffk2
IU
INPUT UNIT
Vin
Vip(VG)

SAMPka

FIG. 9

SAMPka

FIG. 11

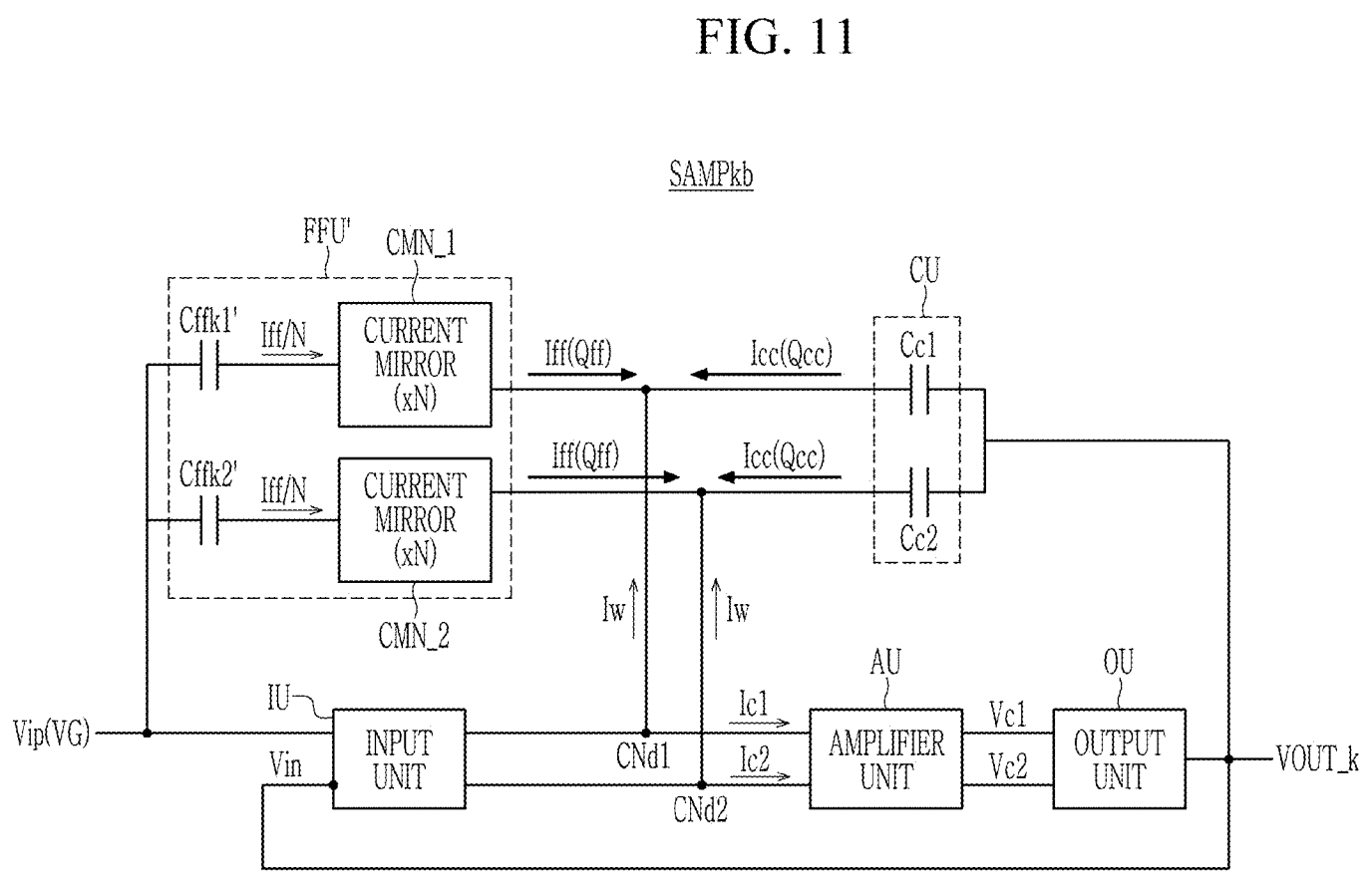

SAMPkb

VOUT_k
OU
OUTPUT UNIT
Vc1
Vc2
AU
AMPLIFIER UNIT
Ic1
Ic2
CNd2
CNd1
Iw
Iw
CU
Cc1
Cc2
Icc(Qcc)
Icc(Qcc)
Iff(Qff)
Iff(Qff)
CMN_1
CURRENT MIRROR (xN)
CURRENT MIRROR (xN)
CMN_2
FFU'
Iff/N
Iff/N
Cffk1'
Cffk2'
IU
INPUT UNIT
Vin
Vip(VG)

FIG. 13

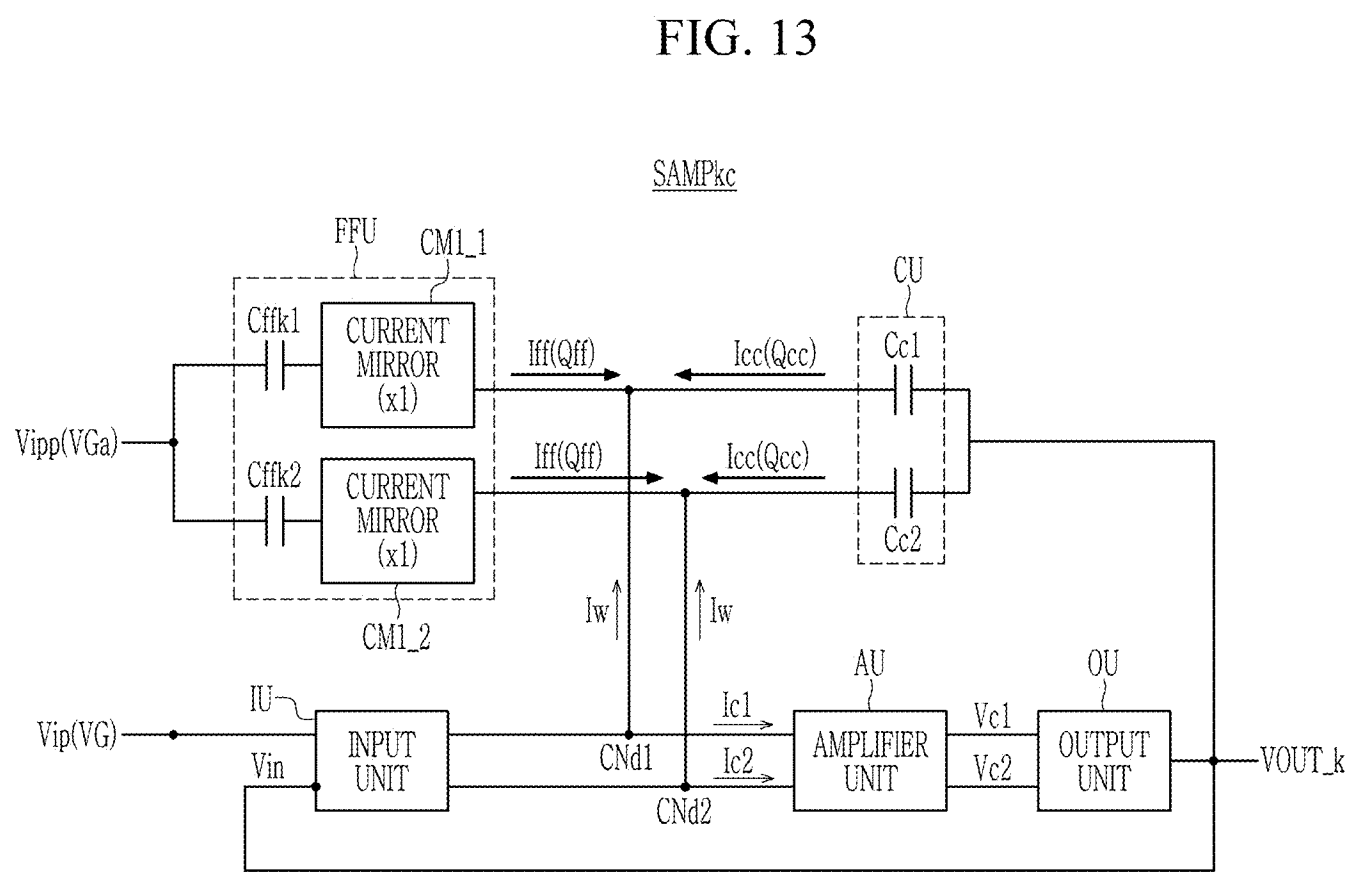

SAMPkc

FFU
CM1_1
CURRENT MIRROR (x1)
CM1_2
CURRENT MIRROR (x1)
Cffk1
Cffk2
Vipp(VGa)
Iff(Qff)
Iff(Qff)
Icc(Qcc)
Icc(Qcc)
CU
Cc1
Cc2
Iw
Iw
CNd1
CNd2
Ic1
Ic2
IU
INPUT UNIT
Vip(VG)
Vin
AU
AMPLIFIER UNIT
Vc1
Vc2
OU
OUTPUT UNIT
VOUT_k

FIG. 15

SAMPc

SOURCE AMPLIFIER AND SOURCE DRIVER INCLUDING SOURCE AMPLIFIER

CROSS-REFERENCE TO RELATED APPLICATION

This application is based on and claims priority under 35 U.S.C. § 119 to Korean Patent Application No. 10-2024-0147530, filed on Oct. 25, 2024, in the Korean Intellectual Property Office, the disclosure of which is incorporated by reference herein in its entirety.

BACKGROUND

The present disclosure relates to a source amplifier and a source driver including the source amplifier.

Display devices used in electronic devices that display images, such as mobile devices, laptop computers, monitors, and TVs, include liquid crystal displays (LCDs) and organic light emitting displays (OLEDs). A display device may include a display panel having a plurality of pixels and a display driver for applying electrical signals to the plurality of pixels, and an image may be implemented by the electrical signals provided by the display driver to the plurality of pixels. Recently, various studies have been conducted to improve the performance of display devices, such as resolution and slew rate, while increasing the stability of electrical signal output.

SUMMARY

Provided are a source amplifier and a source driver with improved frequency characteristics and slew rate performance together.

According to an aspect of the disclosure, a source amplifier includes: an input circuit configured to receive an input signal from an input terminal and an output signal having a complementary relationship with the input signal, and output a first intermediate signal and a second intermediate signal, respectively, to a first intermediate node and a second intermediate node, based on the input signal and the output signal; an amplifier configured to amplify the first intermediate signal and the second intermediate signal, to output a third intermediate signal and a fourth intermediate signal; an output circuit configured to output the output signal, which is a data voltage, to an output terminal, based on the third intermediate signal and the fourth intermediate signal; a compensator including a first capacitor connected between the output terminal and the first intermediate node, and a second capacitor connected between the output terminal and the second intermediate node; and a feed-forward circuit including a third capacitor connected to the first intermediate node and corresponding to the first capacitor, and a fourth capacitor connected to the second intermediate node and corresponding to the second capacitor.

According to an aspect of the disclosure, a source amplifier includes: a first differential transistor pair of first conductivity type that operates based on an input signal and an output signal with a complementary relationship to the input signal, connected to a first and second node; a second differential transistor pair of second conductivity type that operates based on the input and output signals, connected to a third and fourth node; a first current mirror connected between a first set of the first and second nodes and a first power source voltage line; a first bias circuit connected between the first set of the first and second nodes and a second set of a fifth and sixth node; a second current mirror connected between a third set of the third and fourth nodes and a second power source voltage line; a second bias circuit connected between the third set of the third and fourth nodes and a fourth set of a seventh and eighth node; an output buffer configured to buffer an amplified voltage based on a sixth voltage of the sixth node and an eighth voltage of the eighth node to an output terminal; a first capacitor connected between the output terminal and the second node; a second capacitor connected between the output terminal and the fourth node; a third capacitor connected to the second node and corresponding to the first capacitor; and a fourth capacitor connected to the fourth node and corresponding to the second capacitor.

According to an aspect of the disclosure, a source driver includes: a gamma voltage generator with multiple gamma lines to provide various gamma voltages; a decoder to select the gamma lines based on image data; and a first source amplifier including: a first input circuit that receives a first input signal from the decoder and a first input terminal, and a first output signal complementary to the first input signal, and outputs a first intermediate signal and a second intermediate signal to a first and second intermediate node, respectively; a first amplifier that outputs a third and fourth intermediate signal by amplifying the first and second intermediate signals; a first output circuit that outputs the first output signal (a first data voltage) to a first output terminal based on the third and fourth intermediate signals; a first compensator including: a first capacitor between the first output terminal and the first intermediate node, and a second capacitor between the first output terminal and the second intermediate node; and a first feed-forward circuit including: a third capacitor connected to the first intermediate node, corresponding to the first capacitor, and a fourth capacitor connected to the second intermediate node, corresponding to the second capacitor.

BRIEF DESCRIPTION OF DRAWINGS

The above and other aspects, features, and advantages of certain embodiments of the disclosure will be more apparent from the following description taken in conjunction with the accompanying drawings, in which:

FIG. 1 illustrates a display device according to an embodiment;

FIG. 4 illustrates a source amplifier according to an embodiment;

FIG. 6 illustrates a decoder, a gamma voltage generator, and a plurality of source amplifiers according to an embodiment;

FIG. 7 illustrates an operation of a source amplifier according to an embodiment;

FIG. 9 illustrates an operation of a source amplifier according to an embodiment;

FIG. 11 illustrates a source amplifier according to an embodiment;

FIG. 13 illustrates a source amplifier according to an embodiment;

FIG. 15 illustrates a source amplifier according to an embodiment;

DETAILED DESCRIPTION

Figure 2:
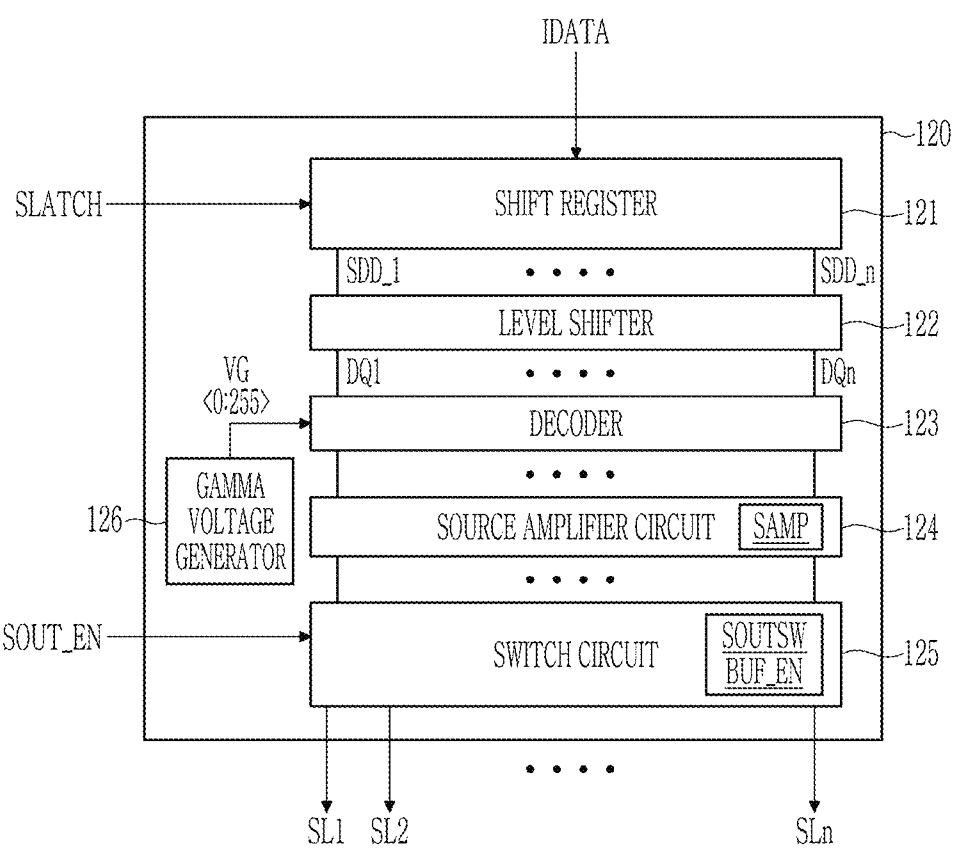
FIG. 2 illustrates a source driver according to an embodiment.

Hereinafter, the present disclosure will be described in detail hereinafter with reference to the accompanying drawings, in which embodiments of the present disclosure are shown. As those skilled in the art would realize, the described embodiments may be modified in various different ways, all without departing from the spirit or scope of the present disclosure.

In order to clearly describe the present disclosure, parts or portions that are irrelevant to the description are omitted, and identical or similar constituent elements throughout the specification are denoted by the same reference numerals.

In addition, unless explicitly described to the contrary, the word "comprise", and variations such as "comprises" or "comprising", will be understood to imply the inclusion of stated elements but not the exclusion of any other elements.

Additionally, specific numbers described in a claim, even if explicitly recited within the claim, should not be construed as limiting the specific number in claims where such citation does not exist. For example, as an aid to understanding, the following appended claims may contain usage of the introductory phrases "at least one" and "one or more" to introduce claim recitations. However, the use of such a phrase should not be understood as a limitation described by the unclear article "one" for the sake of one example.

Furthermore, in those instances where a convention analogous to "at least one of A. B, and C, etc." is used, in general such a construction is intended in the sense one having skill in the art would understand the convention (e.g., "a system having at least one of A, B, and C" would include but not be limited to systems that have A alone, B alone, C alone, A and B together, A and C together, B and C together, and/or A, B, and C together, etc.). It will be further understood by those within the art that virtually any disjunctive word and/or phrase presenting two or more alternative terms, whether in the description, claims, or drawings, should be understood to contemplate the possibilities of including one of the terms, either of the terms, or both terms. For example, the phrase "A or B" will be understood to include the possibilities of "A" or "B" or "A and B."

In an embodiment, 'a module', 'a unit', or 'a part' perform at least one function or operation, and may be realized as hardware, such as a processor or integrated circuit, software that is executed by a processor, or a combination thereof.

FIG. 1 illustrates a display device according to an embodiment.

Referring to FIG. 1, a display device 10*a* may include a display driver IC (DDI) 100*a* and a display panel 11. The display device 10*a* may be included in, for example, an electronic device such as a portable communication terminal, a smartphones, a personal digital assistant (PDA), a personal media player (PMP), a wearable device, a camera, a handheld game console, an e-book reader, or a tablet PC.

The display panel 11 may include a plurality of pixels PX. For example, the display device 10*a* may receive image data IDATA from another component (e.g., an application processor (AP)) of the electronic device including the display device 10*a*. The display device 10*a* may display the received image data or an image corresponding to the received image data IDATA through the plurality of pixels PX of the display panel 11.

The display panel 11 may include the plurality of pixels PX. Each of the plurality of pixels PX may be connected to a corresponding gate line among a plurality of gate lines GL1 to GLm that are sequentially arranged and a corresponding source line among a plurality of source lines SL1 to SLn that are sequentially arranged. Each of the plurality of pixels PX may display image information corresponding to voltages or signals of a corresponding gate line and a corresponding source line. Each of the plurality of pixels PX may display one among a plurality of colors. For example, one pixel may display any one color of red, green, and blue.

In an embodiment, the display panel 11 may be implemented as an organic light-emitting diode (OLED) display panel including a plurality of transistors and diodes. For example, a gate terminal of a transistor among the transistors may be connected to one of the plurality of gate lines GL1 to GLm. A first terminal (e.g., source) of the transistor may be connected to one of the plurality of source lines SL1 to SLn. A second terminal (e.g., drain) of the transistor may be connected to a diode.

Examples of implementing the display panel 11 is not limited to what is shown in FIG. 1. For example, the display panel 11 may be implemented as various types of display panels such as a liquid crystal display (LCD) panel. In this case, the plurality of pixels PX may include components that are different from what is shown in FIG. 1. For example, when the display panel 11 is implemented as an LED panel, each of the plurality of pixels PX may include liquid crystal instead of a diode, depending on embodiments. In this case, the display device 10*a* may further include a component such as a backlight.

The display driver IC 100*a* may include a logic block 110, a source driver 120, a gate driver 130, a memory 140, and an electrical power source 150.

In an embodiment, the logic block 110 may be referred to as a timing controller, or may include a timing controller.

The logic block 110 may receive the image data IDATA to be displayed on the display panel 11 and timing signals such as a horizontal synchronization signal HSYNC, a vertical synchronization signal VSYNC, a clock signal CLK, and a data enable signal DE from the outside of the display device 10*a*. The logic block 110 generate a variety of control signals CTRLS such as an output enable signal in order to control the source driver 120, the gate driver 130, the memory 140, and the electrical power source 150 based on the timing signals.

For example, the logic block 110 may generate control signals for controlling the source driver 120 and the gate driver 130 so that each of the plurality of pixels PX may display corresponding image information. For example, the logic block 110 may generate the plurality of control signals CTRLS for controlling the source driver 120 based on the timing signals received from an external device.

Under the control of the logic block 110, the source driver 120 may provide the image information to be displayed to the plurality of pixels PX through the plurality of source lines SL1 to SLn. For example, in response to the plurality of control signals CTRLS generated by the logic block 110, the source driver 120 may convert the image data IDATA to data voltages to be displayed on the display panel 11. The source driver 120 may provide data voltages to the plurality of pixels PX through the plurality of source lines SL1 to SLn.

In an embodiment, the source driver 120 may include source channels connected to the plurality of source lines SL1 to SLn, respectively. One source channel may include a decoder 123 (see FIG. 2) configured to select one among a plurality of gamma voltages generated by a gamma voltage generator 126 (see FIG. 2) based on input image data and a source amplifier SAMP (see FIG. 2) configured to amplify or buffer the selected gamma voltage and provide the amplified or buffered gamma voltage to the plurality of pixels PX as a data voltage within a predetermined time. A detailed description of configuration and operation of the source driver 120 will be to be described later with reference to FIG. 2 to FIG. 14.

Under the control of the logic block 110, the gate driver 130 may control the plurality of gate lines GL1 to GLm. For example, the gate driver 130 may sequentially provide gate signals to the plurality of gate lines GL1 to GLm that are sequentially arranged. A gate signal may activate the plurality of pixels PX connected to a corresponding gate line.

The memory 140 may be referred to as a graphic memory, a graphic random-access memory (GRAM), or the like. The memory 140 may receive data to be output through the source driver 120 from the logic block 110, and may store the received data. For example, the logic block 110 may transmit the image data IDATA received from the outside of the display device 10 to the memory 140. Unlike what is shown in FIG. 1, under the control of the logic block 110, the memory 140 may directly transmit the stored data to the source driver 120.

For example, when a still image is displayed through the display device 10, the memory 140 may output stored image data IDATA, and thereby prevent the display device 10 from continuously receiving other image data from an external device. The memory 140 may lower electrical power consumed by the display device 10, and may decrease heat generation at the display device 10. Unlike what is shown, the display driver IC **100*a* may not include the memory 140. Unlike what is shown, the display driver IC 100*a*** may include two or more memories.

The electrical power source 150 may supply electrical power to the logic block 110, the source driver 120, the gate driver 130, and the memory 140. The electrical power source 150 may supply electrical power necessary for driving respective components of the display device 10.

In an embodiment, the display device 10 may display an image in frame units. A time period necessary for displaying one frame may be defined as a vertical synchronization signal VSYNC in a vertical period. The vertical period may be determined by a refresh rate of the display device 10. For example, when the refresh rate of the display device 10 is 60 Hz, the vertical period may be 1/60 second, approximately 16.7 ms.

During one vertical period, the gate driver 130 may scan each of the plurality of gate lines GL1 to GLm. For example, under the control of the logic block 110, the gate driver 130 may sequentially apply a gate signal to the plurality of gate lines GL1 to GLm. A time period necessary for the gate driver 130 to scan each of the plurality of gate lines GL1 to GLm may be defined as a horizontal period. The horizontal period may be the same as a period of the horizontal synchronization signal HSYNC, During one horizontal period, the source driver 120 may apply a gray voltage to a pixel PX of the display panel 11. The gray voltage may be a data voltage output from the source driver 120 based on the image data IDATA. By the gray voltage, a brightness of the pixels PX of the display panel 11 may be determined.

Figure 3:
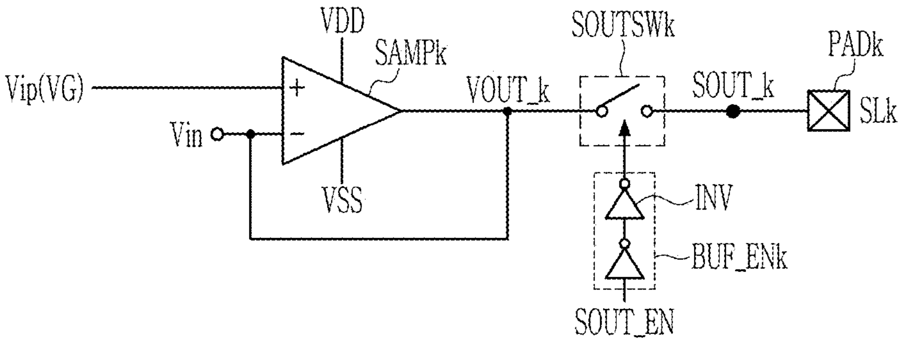
FIG. 3 illustrates a source amplifier, an output switch, and an output pad according to an embodiment.

FIG. 2 illustrates a source driver according to an embodiment. FIG. 3 illustrates the source amplifier, the output switch, and the output pad according to an embodiment.

Referring to FIG. 2 and FIG. 3, the source driver 120 may include a shift register 121, a level shifter 122, a decoder 123, a source amplifier circuit 124, a switch circuit 125, and the gamma voltage generator 126. The configurations 121, 122, 123, 124, 125, and 126 in the source driver 120 is not limited to the shown embodiment, and may be modified to various other forms.

The shift register 121 may receive image data IDATA and a latch signal SLATCH from the logic block 110. The latch signal SLATCH may be a signal representing that new data to be output by the source driver 120 are received to the shift register 121 (or, a signal representing that the data stored in the shift register 121 are updated to an output terminal).

When the display driver IC **100*a* operates in a high-rate driving mode, the latch signal SLATCH may be toggled for multiple times in one line time. As an example, in one line time, while an output enable signal SOUTEN is toggled to a low level signal, the latch signal SLATCH signal may be toggled for multiple times and input to the shift register 121. When the display driver IC 100*a*** is not driven at a high rate, the latch signal SLATCH signal may be toggled based on the horizontal synchronization signal HSYNC.

Under the control of the logic block 110, the shift register 121 may sample the image data IDATA input in series or in parallel, and store the sampled image data IDATA in a plurality of latches corresponding to a source channel connected to the plurality of source lines SL1 to SLn, respectively, in parallel. The shift register 121 may sample the image data IDATA, and may transmit latch digital data SDD_1 to SDD_n latched to the output terminal of the shift register 121 to the level shifter 122. In an embodiment, the shift register 121 may include a sampling circuit for sampling data and a holding latch for storing data sampled by the sampling circuit.

The level shifter 122 may be provided with the latch digital data SDD_1 to SDD_n of the shift register 121, and may transmit shifted image data DQ1 to DQn of which a voltage level is shifted to the decoder 123 to swing between targeted voltage levels.

The decoder 123 may receive the shifted image data DQ1 to DQn of the level shifter 122 and a plurality of gamma voltages VG of the gamma voltage generator 126. The number of the plurality of gamma voltages VG may be determined based on the number of colors to be displayed through the display panel 11 or the number of bits of image data provided from the outside of the display device **10*a***.

As an example, when the image data IDATA is 8-bit data, the number of gamma voltages VG may be 256 corresponding to the number of bits of the image data IDATA. As an example, the plurality of gamma voltages VG may sequentially include 0-th to 255-th gamma voltages VG<0:255> having high voltage levels, and the decoder 123 may be connected to the gamma voltage generator 126 through 0-th to 255-th gamma lines providing the 0-th to 255-th gamma voltages VG<0:255>.

The decoder 123 may select one among the plurality of gamma voltages VG in response to the shifted image data DQ1 to DQn of the level shifter 122. The decoder 123 may output the selected gamma voltage(s) to the source amplifier circuit 124. In an embodiment, the decoder 123 may include a plurality of switches, and may vary a connection relationship between a plurality of provided gamma lines and the source amplifier circuit 124. The decoder 123 according to an embodiment may be implemented as a digital-to-analog converter.

In an embodiment, the decoder 123 may include a plurality of source decoders corresponding to the plurality of source lines SL1 to SLn. Each of the plurality of source decoders may be included in a plurality of source channels corresponding to the plurality of source lines SL1 to SLn, respectively.

The source amplifier circuit 124 may include a plurality of source amplifiers SAMP. The plurality of source amplifiers SAMP may include a k-th source amplifier SAMPk connected to a k-th source line SLk which is one among the plurality of source lines SL1 to SLn. Here, k is an arbitrary integer of one (1) to n. Hereinafter, the plurality of source amplifiers SAMP will be described based on the k-th source amplifier SAMPk. It is obvious that the description of the k-th source amplifier SAMPk may be applied to the plurality of source amplifiers SAMP, respectively.

The k-th source amplifier SAMPk may be implemented as an operational amplifier. The k-th source amplifier SAMPk may include a positive input terminal to which a first input voltage Vip is applied, a negative input terminal to which a second input voltage Vin is applied, and an output terminal to which a k-th output voltage VOUT_k is output. A first power source voltage VDD and a second power source voltage VSS may be provided from the electrical power source 150 to the k-th source amplifier SAMPk.

The negative input terminal of the k-th source amplifier SAMPk is connected to the output terminal of the k-th source amplifier SAMPk, and thus the k-th source amplifier SAMPk may have a feedback path. For example, the k-th output voltage VOUT_k may be input to the k-th source amplifier SAMPk as the second input voltage Vin. The first input voltage Vip and the second input voltage Vin input to the positive input terminal and the negative input terminal respectively, may have a complementary relationship with each other as a differential input signals to the k-th source amplifier SAMPk.

The k-th source amplifier SAMPk may be implemented as a unit buffer. In an embodiment, the k-th source amplifier SAMPk may have a unity gain with a voltage gain of 1 as a voltage follower buffer. In an embodiment, the k-th source amplifier SAMPk may adjust the k-th output voltage VOUT_k to be identical to the first input voltage Vip through the feedback path. A detailed description of the k-th source amplifier SAMPk will be described later with reference to FIG. 4 to FIG. 14.

The k-th source amplifier SAMPk may receive a gamma voltage VG selected by the decoder 123 as the first input voltage Vip and buffer the selected gamma voltage VG, and may output a data voltage (or gray voltage) as the k-th output voltage VOUT_k and provide the output data voltage to a k-th output switch SOUTSWk of the switch circuit 125.

The switch circuit 125 may receive an output enable signal SOUTEN from the logic block 110, and may receive an output voltage of the plurality of source amplifiers SAMP as a data voltage. The switch circuit 125 may output or block the received data voltage to the plurality of source lines SL1 to SLn, based on the output enable signal SOUTEN.

The switch circuit 125 may include a plurality of output switches SOUTSW configured to operate based on the output enable signal SOUTEN, and a plurality of output enable buffers BUF_EN configured to receive the output enable signal SOUTEN and provide the output enable signal SOUTEN to the plurality of output switches SOUTSW.

The plurality of output switches SOUTSW may include the k-th output switch SOUTSWk connected between the k-th source amplifier SAMPk and a k-th output pad PADk, and the plurality of output enable buffers BUF_EN may include a k-th output enable buffer BUF_ENk configured to provide the output enable signal SOUTEN to the k-th output switch SOUTSWk. Here, k is an arbitrary integer of 1 to n.

The k-th output enable buffer BUF_ENk may receive the output enable signal SOUTEN from the logic block 110, and may maintain the output enable signal SOUTEN input as a buffer. In an embodiment, the k-th output enable buffer BUF_ENk may include a plurality of internal inverters INV. When a switching operation or a toggle of the output enable signal SOUTEN is not generated, a dynamic current may not flow to the k-th output enable buffer BUF_ENk, and charging and discharging operations of the internal inverter INV may not be performed.

The k-th output switch SOUTSWk may connect the k-th source amplifier SAMPk and the k-th output pad PADk or release the connection therebetween, in response to the output enable signal SOUTEN. For example, the k-th output switch SOUTSWk may be opened or short-circuited in response to the output enable signal SOUTEN. In response to the k-th output switch SOUTSWk being short-circuited, the k-th output voltage VOUT_k of the k-th source amplifier SAMPk may be applied to the k-th source line SLk via the k-th output pad PADk as a k-th source output voltage SOUT_k of the source driver 120. In response to the k-th output switch SOUTSWk being opened, the output of the k-th source output voltage SOUT_k to the k-th output pad PADk and the k-th source line SLk may be blocked. The k-th source output voltage SOUT_k may be the output voltage of the source driver 120, which is a data voltage that can be output to the k-th source line SLk.

In an embodiment, a data the latch signal SLATCH and the output enable signal SOUTEN may be included in control signals CTRLS generated by the logic block 110.

FIG. 4 illustrates a source amplifier according to an embodiment. Specifically, the k-th source amplifier SAMPka of FIG. 4 shows an example of the k-th source amplifier SAMPk of FIG. 3.

Referring to FIG. 3 and FIG. 4, the k-th source amplifier SAMPka may include an input unit (or an input circuit) IU, an amplifier unit (or an amplifier) AU, an output unit (or an output circuit) OU, a compensator unit (or a compensator) CU, and a feed-forward unit (or feed-forward circuit) (FFU). Although it is illustrated that the k-th source amplifier SAMPka includes five circuit blocks, an embodiment is not limited thereto, and various forms of blocks may be available. In an embodiment, the circuits of the k-th source amplifier SAMPka may be formed into blocks to include the input unit and the output unit.

In an embodiment, bias voltages of various levels may be provided to the k-th source amplifier SAMPka, and according to the bias voltages, the current (e.g., static current) flowing through the input unit IU, the amplifier unit AU, the output unit OU, the compensator unit CU, and a feed-forward unit FFU may be controlled.

The k-th source amplifier SAMPka may be a buffer disposed to correspond to one source channel, and accordingly, may receive the gamma voltage VG through the positive input terminal as the first input voltage Vip, and in addition, may receive the k-th output voltage VOUT_k corresponding to the data voltage through the negative input terminal as the second input voltage Vin. That is, the k-th source amplifier SAMPka may include a negative feedback path.

The input unit IU may have a differential mode input structure, and may receive a first input voltage Vip and a second input voltage Vin. The first input voltage Vip and the second input voltage Vin have a complementary relationship. In an embodiment, the input unit IU may form a folded cascode structure together with the amplifier unit AU, and may perform an amplification operation.

The input unit IU may provide a first intermediate current Ic1 and a second intermediate current Ic2 to the amplifier unit AU through a first intermediate node CNd1 and a second intermediate node CNd2, according to the first input voltage Vip and the second input voltage Vin. In an embodiment, the first intermediate current Ic1 and the second intermediate current Ic2 may be an intermediate signal of the k-th source amplifier SAMPka, and may be provided to the amplifier unit AU as a driving signal for the amplifier unit AU. Based on the voltage difference between the first input voltage Vip and the second input voltage Vin, the first intermediate current Ic1 and the second intermediate current Ic2 may have currents of different magnitudes.

As a leakage current for respect to the first intermediate current Ic1 and the second intermediate current Ic2, a consumption current Iw may be provided from the input unit IU to compensation capacitors Cc1 and Cc2 in the compensator unit CU through the first intermediate node CNd1 and the second intermediate node CNd2. When the compensation capacitors Cc1 and Cc2 are charged or discharged, the consumption current Iw may be provided to the compensation capacitors Cc1 and Cc2.

In a transition period in which the k-th output voltage VOUT_k varies, the consumption current Iw (provided to the compensation capacitors Cc1 and Cc2 in the compensator unit CU) may be blocked, and the current magnitude may be 0. In an embodiment, a sum of the first intermediate current Ic1 and the second intermediate current Ic2 and the consumption current Iw may be determined by a current source in the input unit IU, and may have a predetermined magnitude.

The amplifier unit AU may receive the first intermediate current Ic1 and the second intermediate current Ic2, which are intermediate signals output from the input unit IU, and amplify the first intermediate current Ic1 and the second intermediate current Ic2. The amplifier unit AU may form a folded cascode structure together with the input unit IU, and may perform the amplification operation.

The amplifier unit AU may perform the amplification operation with respect to the first intermediate current Ic1 and the second intermediate current Ic2, and provide a first intermediate voltage Vc1 and a second intermediate voltage Vc2 to the output unit OU. The amplifier unit AU may include at least one current mirror, and the amplification operation of the amplifier unit AU may include a current mirroring operation of each current mirror.

The output unit OU may be or correspond to an output buffer, and based on the first intermediate voltage Vc1 and the second intermediate voltage Vc2, which are intermediate signals, may output a specific voltage between the first power source voltage VDD and the second power source voltage VSS as an output signal of the k-th output voltage VOUT_k to the output terminal. The output unit OU may output the k-th output voltage VOUT_k as the data voltage to the output terminal, based on the first intermediate voltage Vc1 and the second intermediate voltage Vc2. In an embodiment, the output unit OU may include at least two transistors, and operate as a buffer of a class AB type, but the disclosure is not limited thereto.

The compensator unit CU may be disposed between (a set of) the first intermediate node CNd1 and the second intermediate node CNd2 and the output terminal. The compensator unit CU may improve and compensate the frequency characteristic and phase margin of the k-th source amplifier SAMPka. The compensator unit CU may prevent an oscillation at the output terminal in a compensation period, and may provide stability of the k-th output voltage VOUT_k.

In an embodiment, the compensator unit CU may include a first compensation capacitor Cc1 (arranged between a first intermediate node CNd1 and the output terminal) and a second compensation capacitor Cc2 (arranged between a second intermediate node CNd2 and the output terminal). The first compensation capacitor Cc1 and the second compensation capacitor Cc2 may be referred to as a "Miller capacitor".

In the transition period in which the k-th output voltage VOUT_k is varied, a compensation current Icc may be generated in the first compensation capacitor Cc1 and the second compensation capacitor Cc2, and during the transition period, the amount of accumulated charge of the first compensation capacitor Cc1 and the second compensation capacitor Cc2 may vary by a compensation amount of charge Qcc by the compensation current Icc.

The feed-forward unit FFU may be disposed between the input terminal and (a set of) the first intermediate node CNd1 and the second intermediate node CNd2, and the feed-forward unit FFU may include a k_1-th feed-forward capacitor Cffk1 disposed between the first intermediate node CNd1 and the input terminal and corresponding to the first compensation capacitor Cc1, a first equivalent current mirror CM1_1 disposed between the k_1-th feed-forward capacitor Cffk1 and the first intermediate node CNd1, a k_2-th feed-forward capacitor Cffk2 disposed between the second intermediate node CNd2 and the input terminal and corresponding to the second compensation capacitor Cc2, and a second equivalent current mirror CM1_2 disposed between the k_2-th feed-forward capacitor Cffk2 and the second intermediate node CNd2.

The capacitance of each of the k_1-th and k_2-th feed-forward capacitors Cffk1 and Cffk2 is the same as the capacitance of each of the first compensation capacitor Cc1 and the second compensation capacitor Cc2, but the closure is not limited thereto, and the magnitude may vary depending on the design purpose.

As the first input voltage Vip varies in the transition period, a feed-forward current Iff may be generated in the k_1-th and k_2-th feed-forward capacitors Cffk1 and Cffk2, in response to the compensation current Icc.

In the transition period, the first equivalent current mirror CM1_1 and the second equivalent current mirror CM1_2 may match the feed-forward current Iff and the compensation current Icc through the current mirroring operation. While the first equivalent current mirror CM1_1 and the second equivalent current mirror CM1_2 perform the current mirroring operation, the magnitude of the feed-forward current Iff and the magnitude of the compensation current Icc may be the same, and the consumption current Iw provided from the input unit IU to the first compensation capacitor Cc1 and the second compensation capacitor Cc2 may be blocked. That is, while the first equivalent current mirror CM1_1 and the second equivalent current mirror CM1_2 perform the current mirroring operation, the consumption current Iw may be 0.

During at least a part of the transition period, the magnitude of the feed-forward current Iff and the magnitude of the compensation current Icc are the same, and the consumption current Iw provided from the input unit IU to the first compensation capacitor Cc1 and the second compensation capacitor Cc2 may be blocked. Based on the blocking of the consumption current Iw, the magnitude of the first intermediate current Ic1 and the second intermediate current Ic2 may increase, and by the increase of the first intermediate current Ic1 and the second intermediate current Ic2, the output of the amplifier unit AU increases, and the performance of the output unit OU may be improved, so that the slew rate for the k-th output voltage VOUT_k may be accelerated.

In an embodiment, during the transition period, the amount of accumulated charge of the k_1-th and k_2-th feed-forward capacitors Cffk1 and Cffk2 may vary by a feed-forward amount of charge Qff by the feed-forward current Iff. The amount of change of the first input voltage Vip in the transition period may be the same as the amount of change of the k-th output voltage VOUT_k, and the feed-forward amount of charge Qff and the compensation amount of charge Qcc may be the same.

While the amount of accumulated charge of the k_1-th and k_2-th feed-forward capacitors Cffk1 and Cffk2 vary as much as the feed-forward amount of charge Qff in the transition period, the first equivalent current mirror CM1_1 and the second equivalent current mirroring CM1_2 may perform the current mirroring operation so that the amount of accumulated charge of the first compensation capacitor Cc1 and the second compensation capacitor Cc2 may also vary as much as the compensation amount of charge Qcc that is the same as the feed-forward amount of charge Qff. That is, the consumption current Iw may be blocked in the entire period of the transition period, the output of the amplifier unit AU increases in the entire period of the transition period, and the performance of the output unit OU may be improved, so that the slew rate for the k-th output voltage VOUT_k may be accelerated.

Through the compensator unit CU and the feed-forward unit FFU, the k-th source amplifier SAMPka may improve the performance of operation speed for the k-th output voltage VOUT_k while improving the frequency characteristics.

In an embodiment, the feed-forward unit FFU may share the current mirror in the amplifier unit AU as the first equivalent current mirror CM1_1 and the second equivalent current mirror CM1_2, but the disclosure is not limited thereto.

Figure 5:
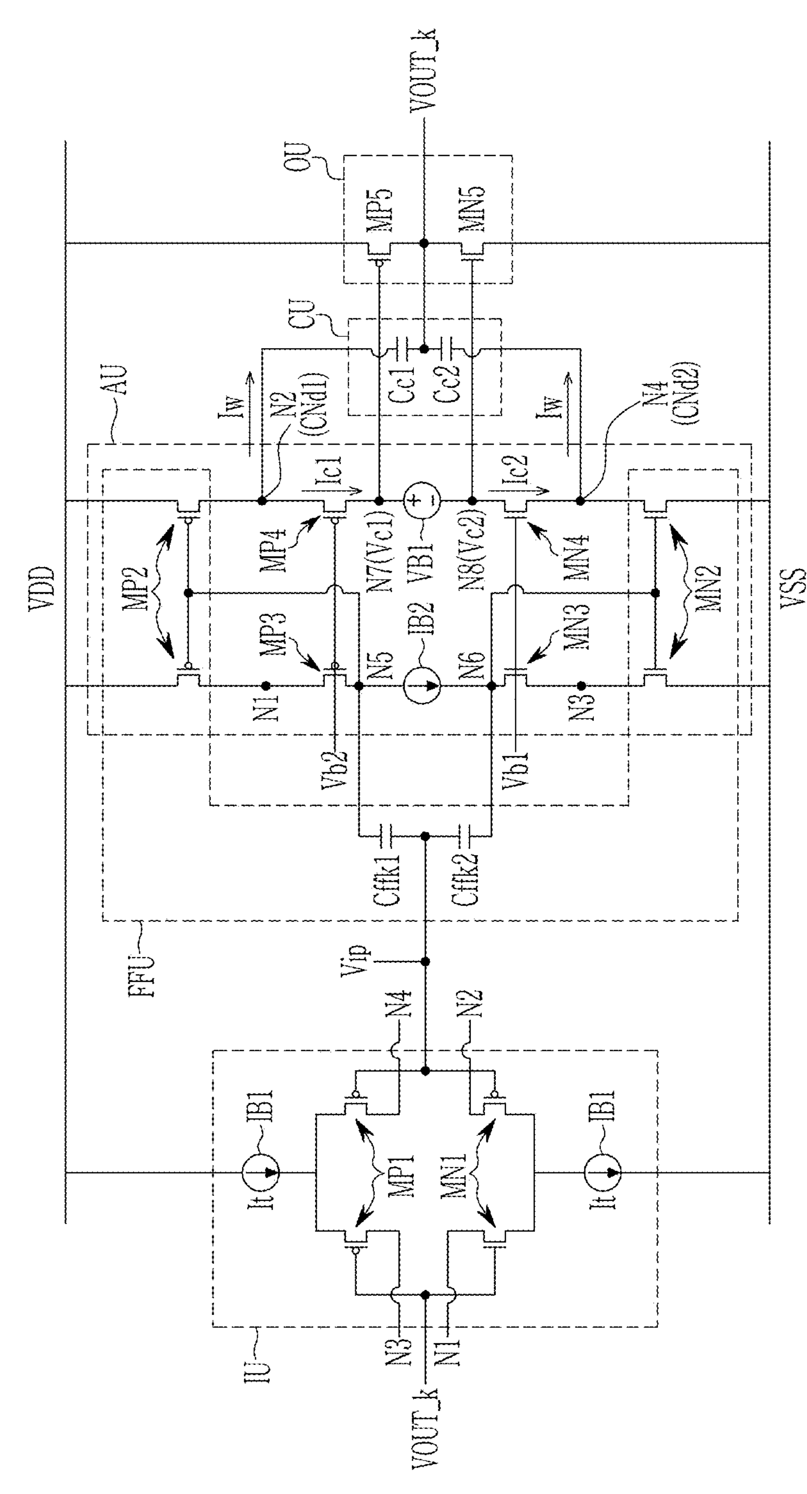
FIG. 5 illustrates a source amplifier according to an embodiment.

FIG. 5 illustrates a source amplifier according to an embodiment. Specifically, FIG. 5 is an exemplary circuit diagram for the k-th source amplifier SAMPka of FIG. 4.

Referring to FIG. 4 and FIG. 5, the k-th source amplifier SAMPka may include a first tail current source IB1, a first differential transistor pair MN1 (only one reference numeral is used since it is a matching transistor, and hereinafter, a transistor pair existing in a pair but referenced by using only one reference numeral means a matching transistor), a second differential transistor pair MP1, a first current mirror MP2, a first bias circuits MP3 and MP4, a second current mirror MN2, a second bias circuits MN3 and MN4, a bias constant current source IB2, a bias constant voltage source VB1, the output buffers MP5 and MN5, a pair of compensation capacitors Cc1 and Cc2, and a k-th pair of feed-forward capacitors Cffk1 and Cffk2.

The first tail current source IB1, the first differential transistor pair MN1, the second differential transistor pair MP1 may be driven as the input unit IU. The first differential transistor pair MN1 may be an NMOS transistor pair of first conductivity type. The second differential transistor pair MP1 may be a PMOS transistor pair of second conductivity type different from the first conductivity type. Each of the first differential transistor pair MN1 and the second differential transistor pair MP1 may be driven in response to (or based on) the k-th output voltage VOUT_k, i.e., the first input voltage Vip and the second input voltage Vin, and each may have a corresponding the first tail current source IB1.

The first differential transistor pair MN1 may be disposed between the second power source voltage line (providing a second power source voltage VSS) and a first node N1 and a second node N2. The first tail current source IB1 may be disposed between the first differential transistor pair MN1 and the second power source voltage line.

The second differential transistor pair MP1 may be disposed between the first power source voltage line (providing a first power source voltage VDD) and a third node N3 and a fourth node N4. The first tail current source IB1 may be disposed between the second differential transistor pair MP1 and the first power source voltage line.

In an embodiment, a second node N2 and a fourth node N4 may be the first intermediate node CNd1 and the second intermediate node CNd2, which are input nodes of the amplifier unit AU.

The first current mirror MP2, the first bias circuits MP3 and MP4, the second current mirror MN2, the second bias circuits MN3 and MN4, the bias constant current source IB2, and the bias constant voltage source VB1 may be driven as the amplifier unit AU.

The first current mirror MP2 may be disposed between the first power source voltage line and the first node N1 and the second node N2, the first bias circuits MP3 and MP4 may be disposed between the first node N1 and the second node N2 and fifth and seventh nodes N5 and N7, and the first current mirror MP2 and the first bias circuits MP3 and MP4 may be coupled in series between the first power source voltage line and the fifth and seventh nodes N5 and N7.

In an embodiment, the current ratio of the first current mirror MP2 may be 1 to 1, and the disclosure is not limited thereto.

The first bias circuits MP3 and MP4 may provide a bias voltage for the first current mirror MP2 to perform the current mirroring operation. A second bias voltage Vb2 may be commonly provided to a gate of a transistor in the first bias circuits MP3 and MP4.

A first amplification transistor MP4 may receive a first intermediate current Ic1 flowing from a second node N2 to a seventh node N7, and may perform an amplification operation based on the first intermediate current Ic1, to output a first intermediate voltage Vc1 to the seventh node N7. The second node N2 may be the first intermediate node CNd1, which is one input node of the amplifier unit AU. The first amplification transistor MP4 among the first bias circuits MP3 and MP4 may receive the first intermediate current Ic1 and may perform the amplification operation based on the first intermediate current Ic1, to apply the first intermediate voltage Vc1 to the seventh node N7. The consumption current Iw may be a leakage current for the first intermediate current Ic1, and may flow from the second node N2 to the first compensation capacitor Cc1. The first intermediate current Ic1 and the consumption current Iw may be generated based on the first tail current source IB1.

The second current mirror MN2 may be disposed between the second power source voltage line and the third node N3 and the fourth node N4. the second bias circuits MN3 and MN4 may be disposed between (a set of) the third node N3 and the fourth node N4 and (a set of) a sixth node N6 and a eighth node N8. The second current mirror MN2 and the second bias circuits MN3 and MN4 may be coupled in series between the second power source voltage line and the sixth node N6 and the eighth node N8.

In an embodiment, a current ratio of the second current mirror MN2 may be one (1) to one (1), and the disclosure is not limited thereto.

The second bias circuits MN3 and MN4 may provide a bias voltage for the second current mirror MN2 to perform the current mirroring operation. A first bias voltage Vb1 may be commonly provided to a gate of a transistor in the second bias circuits MN3 and MN4.

A second amplification transistor MN4 may receive a second intermediate current Ic2 flowing from an eighth node N8 to a fourth node N4, and may perform the amplification operation based on the second intermediate current Ic2, to output a second intermediate voltage Vc2 to the eighth node N8. The fourth node N4 may be the second intermediate node CNd2, which is another input node of the amplifier unit AU. The second amplification transistor MN4 among the second bias circuits MN3 and MN4 may operate as an amplifier to receive the second intermediate current Ic2 and apply the second intermediate voltage Vc2 to the eighth node N8. The consumption current Iw may be a leakage current for the second intermediate current Ic2, and may flow from the fourth node N4 to the second compensation capacitor Cc2. The second intermediate current Ic2 and the consumption current Iw may be generated based on the first tail current source IB1.

The bias constant current source IB2 may be connected between a fifth node N5 and a sixth node N6. The bias constant voltage source VB1 may be connected between the seventh node N7 and the eighth node N8.

In an embodiment, each of the bias constant current source IB2 and the bias constant voltage source VB1 may include a plurality of transistors controlled by a plurality of bias voltages, and may be turned on or turned off by the plurality of bias voltages.

The output buffers MP5 and MN5 may be driven as the output unit OU. The output buffers MP5 and MN5 may buffer an amplified voltage based on the first intermediate voltage Vc1 of the seventh node N7 and the second intermediate voltage Vc2 of the eighth node N8 to the output terminal. The output buffers MP5 and MN5 may include a pull-up transistor MP5 and a pull-down transistor MN5.

The pull-up transistor MP5 may be connected between the first power source voltage line and the output terminal, and may be implemented as a PMOS transistor of the second conductivity type that is gated in response to (or based on) the first intermediate voltage Vc1 of the seventh node N7. The pull-down transistor MN5 may be connected between the second power source voltage line and the output terminal, and may be implemented as a NMOS transistor of the first conductivity type that is gated in response to (or based on) the second intermediate voltage Vc2 of the eighth node N8.

The pair of compensation capacitors Cc1 and Cc2 may be driven as the compensator unit CU. The pair of compensation capacitors Cc1 and Cc2 may include the first compensation capacitor Cc1 and the second compensation capacitor Cc2. The first compensation capacitor Cc1 may be connected between the output terminal and the second node N2, which is the first intermediate node CNd1. The second compensation capacitor Cc2 may be connected between the output terminal and the fourth node N4, which is the second intermediate node CNd2.

The k-th pair of feed-forward capacitors Cffk1 and Cffk2 may be driven as the feed-forward unit FFU together with the first current mirror MP2 and the second current mirror MN2. That is, the feed-forward unit FFU and the amplifier unit AU may be configured to share the first current mirror MP2 and the second current mirror MN2. The first current mirror MP2 and the second current mirror MN2 may be driven as the first equivalent current mirror CM1_1 and the second equivalent current mirror CM1_2 of the feed-forward unit FFU, respectively.

The k-th pair of feed-forward capacitors Cffk1 and Cffk2 may include the k_1-th feed-forward capacitor Cffk1 and the k_2-th feed-forward capacitor Cffk2. The k_1-th feed-forward capacitor Cffk1 may be connected between the input terminal and the fifth node N5. The k_2-th feed-forward capacitor Cffk2 may be connected between the input terminal and the sixth node N6.

Each of the k_1-th feed-forward capacitor Cffk1 and the k_2-th feed-forward capacitor Cffk2 may correspond to each of the first compensation capacitor Cc1 and the second compensation capacitor Cc2. In an embodiment, the capacitance of the k_1-th feed-forward capacitor Cffk1 may be the same as the capacitance of the first compensation capacitor Cc1. The capacitance of the k_2-th feed-forward capacitor Cffk2 may be the same as the capacitance of the second compensation capacitor Cc2, but may vary depending on the design purpose.

In an embodiment, an amount of change in the amount of accumulated charge of the k_1-th and k_2-th feed-forward capacitors Cffk1 and Cffk2 during the transition period of the k-th source amplifier SAMPka may be equal to the amount of change in the amount of accumulated charge of the first compensation capacitor Cc1 and the second compensation capacitor Cc2 in the transition period, but depending on the embodiment, they may be different from each other. In an embodiment, in the compensation period, the applied voltage of the k_1-th and k_2-th feed-forward capacitors Cffk1 and Cffk2 and the applied voltage of the first compensation capacitor Cc1 and the second compensation capacitor Cc2 in the compensation period may be the same.

Figure 6:
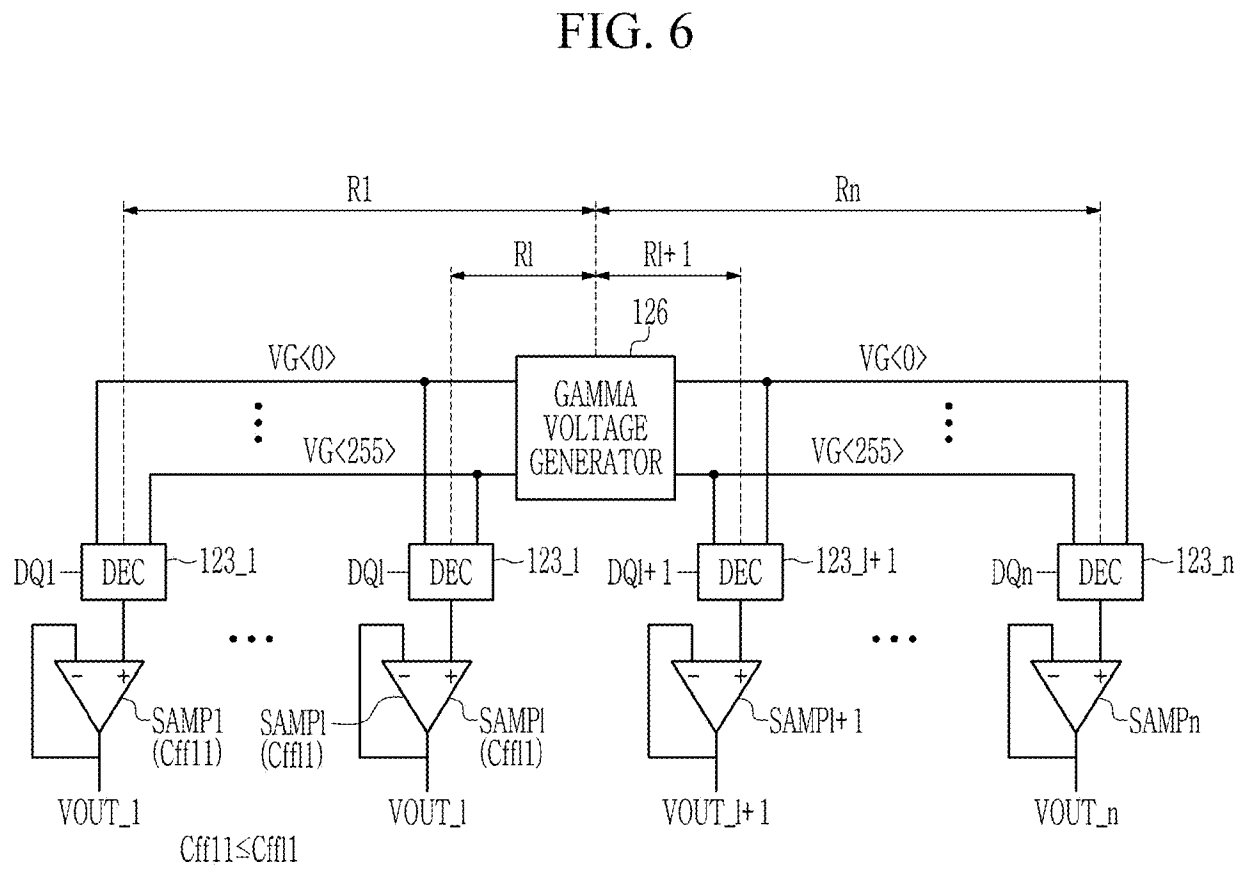

FIG. 6 illustrates a decoder, a gamma voltage generator, and a plurality of source amplifiers according to an embodiment.

Referring to FIG. 2 and FIG. 6, the gamma voltage generator 126 may connected to a first decoder 123_1 to a n-th source decoder 123_*n* through the plurality of gamma lines providing the plurality of gamma voltages VG. In an example of FIG. 6, the gamma voltage generator 126 may be connected to the first to n-th source decoders 123_1 to 123_*n* through the 0-th to 255-th gamma lines providing the 0-th to 255-th gamma voltages VG<0:255>. Each of a first decoder 123_1 to the n-th source decoder 123_*n* may be a configuration included in the decoder 123 of FIG. 2, and may correspond to a source channel for first to n-th source amplifiers SAMP1 to SAMPn.

Each of the first decoder 123_1 to the n-th source decoder 123_*n* may include the plurality of switches, and may vary a connection relationship between the plurality of gamma lines and the first to n-th source amplifiers SAMP1 to SAMPn based on first to n-th shifted image data DQ1 to DQn.

Each of the first decoder 123_1 to the n-th source decoder 123_*n* may be disposed to be spaced apart from the gamma voltage generator 126 by different distance. As an example, the first source decoder 123_1 may be disposed to be spaced apart from the gamma voltage generator 126 by a first distance R1, and a first source amplifier SAMP1 may be electrically connected to the gamma voltage generator 126 through the 0-th to 255-th gamma lines extending to correspond to the first distance R1. A I-th source decoder 123_I may be disposed to be spaced apart from the gamma voltage generator 126 by a I-th distance RI, and a I-th source amplifier SAMPI may be electrically connected to the gamma voltage generator 126 through the 0-th to 255-th gamma lines extending to correspond to the I-th distance RI. A (I+1)-th source decoder 123_I+1 may be disposed to be spaced apart from the gamma voltage generator 126 by a (I+1)-th distance RI+1, and a (I+1)-th source amplifier SAMPI+1 may be electrically connected to the gamma voltage generator 126 through the 0-th to 255-th gamma lines extending to correspond to the (I+1)-th distance RI+1. The n-th source decoder 123_*n* may be disposed to be spaced apart from the gamma voltage generator 126 by a n-th distance Rn, and a n-th source amplifier SAMPn may be electrically connected to the gamma voltage generator 126 through the 0-th to 255-th gamma lines extending to correspond to the n-th distance Rn.

In an embodiment, a first distance R1 to a n-th distance Rn may be different from each other, so that the resistances of gamma lines between the first to n-th source amplifiers SAMP1 to SAMPn and the gamma voltage generator 126 may be different from each other. In an example of FIG. 6, the resistance of the gamma line for the I-th and (I+1)-th source amplifiers SAMPI and SAMPI disposed adjacent to the gamma voltage generator 126 may be smaller than the resistance of the gamma line for the first and n-th source amplifiers SAMP1 and SAMPn disposed spaced far apart from the gamma voltage generator 126. Here, I may be an arbitrary integer between 2 and n−2.

As for the source amplifier according to an embodiment, the capacitance of the feed-forward capacitor in the source amplifier disposed adjacent to the gamma voltage generator 126 may be greater than the capacitance of the feed-forward capacitor in the source amplifier disposed spaced far apart from the gamma voltage generator 126. In an example of FIG. 6, a capacitance of a I_1-th feed-forward capacitor CffI1 of the I-th source amplifier SAMPI may be greater than a 1_1-th feed-forward capacitor Cff11 of the first source amplifier SAMP1. Each of the 1_1-th feed-forward capacitor Cff11 and the I_1-th feed-forward capacitor CffI1 may be a configuration corresponding to the k_1-th feed-forward capacitor Cffk1 of FIG. 4 and FIG. 5 in each of the first source amplifier SAMP1 and the I-th source amplifier SAMPI.

Through capacitance adjustment of the feed-forward capacitor in the source amplifier described above, the source driver 120 according to an embodiment may adjust the input delay due to the RC delay for each source channel, and synchronously provide the input voltage to each source amplifier. The I-th and (I+1)-th source amplifiers SAMPI adjacent to the gamma voltage generator 126 may be provided with the gamma voltage VG through a gamma line of a relatively small resistance, and the first and n-th source amplifiers SAMP1 and SAMPn disposed spaced far apart from the gamma voltage generator 126 may include a feed-forward capacitor with a relatively small capacitance.

In addition to the adjustment for the RC delay as shown in FIG. 6, depending on the embodiment, the capacitance of the feed-forward capacitor in the source amplifier may be adjusted. In order to adjust an overvoltage driving or under voltage driving of the output voltage of the source amplifier, the capacitance of the feed-forward capacitor in the source amplifier may be variously adjusted. As an example, as the number of the plurality of pixels PX connected to one source channel increases, a capacitance magnitude of the feed-forward capacitor in the source amplifier may become greater than a capacitance of the compensation capacitor, so that an overvoltage may be induced in the output voltage of the source amplifier.

Figure 7:
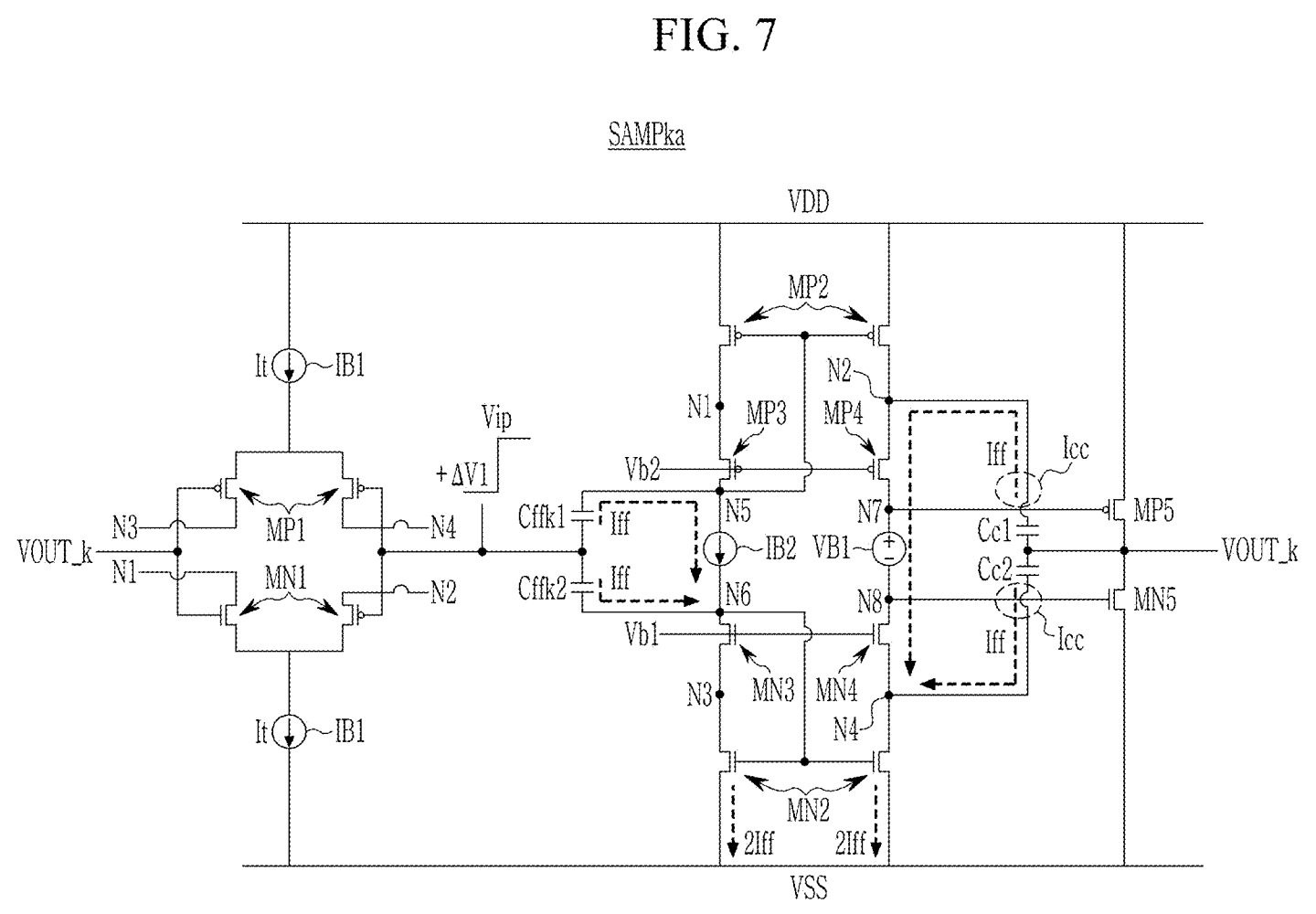
Figure 8:
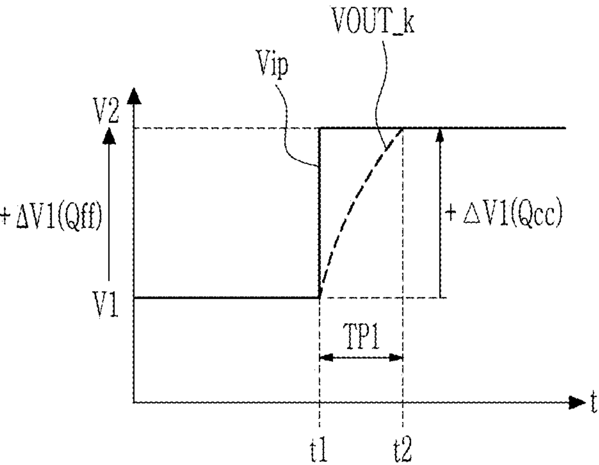
FIG. 8 illustrates a graph for explaining an operation of a source amplifier according to an embodiment.

FIG. 7 illustrates an operation of the source amplifier according to an embodiment. FIG. 8 illustrates a graph for explaining the operation of the source amplifier according to an embodiment. Specifically, FIG. 7 explains the flow of the feed-forward current Iff and the compensation current Icc in the k-th source amplifier SAMPka when the first input voltage Vip increases.

Referring to FIG. 4, FIG. 5, FIG. 7 and FIG. 8, in the compensation period, which is before a time point t1 and before the first input voltage Vip is increased, the first input voltage Vip and the k-th output voltage VOUT_k of the k-th source amplifier SAMPka may maintained constant at a first voltage V1. In the compensation period, the voltage applied to each of the k_1-th and k_2-th feed-forward capacitors Cffk1 and Cffk2 may match the voltage applied to each of the first compensation capacitor Cc1 and the second compensation capacitor Cc2. In an embodiment, in the compensation period, the amount of accumulated charge accumulated in each of the k_1-th and k_2-th feed-forward capacitors Cffk1 and Cffk2 may be the same as the amount of accumulated charge accumulated in each of the first compensation capacitor Cc1 and the second compensation capacitor Cc2.

At the time point t1, the first input voltage Vip may increase by the first voltage gap ΔV1 from the first voltage V1 to a second voltage V2. In response to the increase of the first input voltage Vip, the feed-forward current Iff may flow from each of the k_1-th and k_2-th feed-forward capacitors Cffk1 and Cffk2 to the fifth node N5 and the sixth node N6. Each of the feed-forward current Iff may be combined at a third node N3 to form a double feed-forward current 21*ff*, and then may be provided to the second current mirror MN2. The magnitude of the double feed-forward current 21*ff* may be twice as large as than the magnitude of the feed-forward current Iff.

The double feed-forward current 21*ff* may flow from the fourth node N4 to the second current mirror MN2 through the current mirroring operation of the second current mirror MN2, and the compensation current Icc in the same magnitude as the feed-forward current Iff may flow from each of the first compensation capacitor Cc1 and the second compensation capacitor Cc2 based on the double feed-forward current 21*ff*.

During a first transition period TP1 between the time point t1 and a time point t2, through the feed-forward current Iff and the compensation current Icc, the amount of accumulated charge of the first compensation capacitor Cc1 and the second compensation capacitor Cc2 may vary as much as the compensation amount of charge Qcc that is the same as the feed-forward amount of charge Qff. Through the amount of change in the amount of accumulated charge of the first compensation capacitor Cc1 and the second compensation capacitor Cc2, during the first transition period TP1, the k-th output voltage VOUT_k may increase by the first voltage gap ΔV1 from the first voltage V1 to the second voltage V2.

As a result, through the feed-forward current Iff and the compensation current Icc described above, the k-th source amplifier SAMPka may minimize the consumption current Iw flowing from the second node N2 and the fourth node N4 to the first compensation capacitor Cc1 and the second compensation capacitor Cc2, and may increase the magnitude of the first intermediate current Ic1 and the second intermediate current Ic2, which are driving signal. The increased first intermediate current Ic1 and the increased second intermediate current Ic2 may reduce the time interval of the first transition period TP1, and the slew rate for the k-th output voltage VOUT_k may be accelerated.

Figure 9:
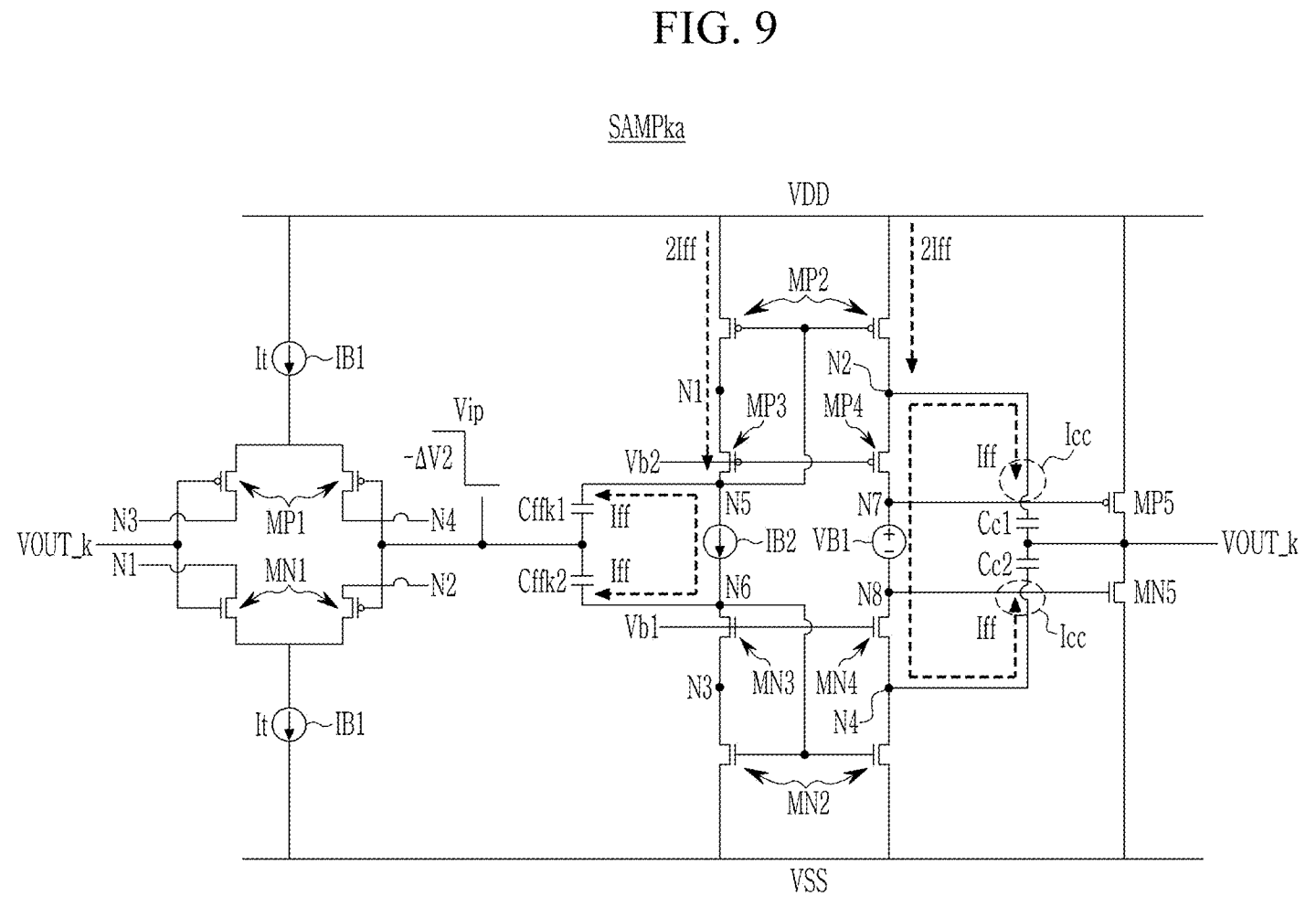
Figure 10:
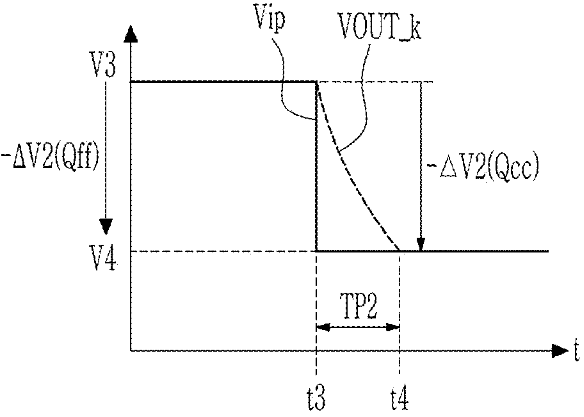
FIG. 10 illustrates a graph for explaining an operation of a source amplifier according to an embodiment.

FIG. 9 illustrates the operation of the source amplifier according to an embodiment. FIG. 10 illustrates a graph for explaining the operation of the source amplifier according to an embodiment. Specifically, FIG. 9 explains the flow of the feed-forward current Iff and the compensation current Icc in the k-th source amplifier SAMPka when the first input voltage Vip decreases.

Referring to FIG. 4, FIG. 5, FIG. 9, and FIG. 10, in the compensation period, which is before a time point t3 and before the first input voltage Vip decreases, the first input voltage Vip and the k-th output voltage VOUT_k of the k-th source amplifier SAMPka may maintained constant at a third voltage V3. In the compensation period, the voltage applied to each of the k_1-th and k_2-th feed-forward capacitors Cffk1 and Cffk2 may match the voltage applied to each of the first compensation capacitor Cc1 and the second compensation capacitor Cc2. In an embodiment, in the compensation period, the amount of accumulated charge accumulated in each of the k_1-th and k_2-th feed-forward capacitors Cffk1 and Cffk2 may be the same as the amount of accumulated charge accumulated in each of the first compensation capacitor Cc1 and the second compensation capacitor Cc2.

At the time point t3, the first input voltage Vip may decrease from the third voltage V3 to a fourth voltage V4 by the second voltage gap ΔV2. In response to (or based on) the decrease of the first input voltage Vip, the feed-forward current Iff may flow from the fifth node N5 and the sixth node N6 to each of the k_1-th and k_2-th feed-forward capacitors Cffk1 and Cffk2. Each of the feed-forward current Iff may be branched from the double feed-forward current 2Iff at the fifth node N5, and may flow from the k_1-th and k_2-th feed-forward capacitors Cffk1 and Cffk2. The double feed-forward current 2Iff may be provided from the first current mirror MP2, and the magnitude of the double feed-forward current 2Iff may be twice as large as the magnitude of the feed-forward current Iff.

The double feed-forward current 2Iff may flow from the first current mirror MP2 to the second node N2 through the current mirroring operation of the first current mirror MP2. The compensation current Icc in the same magnitude as the feed-forward current Iff may flow from each of the first compensation capacitor Cc1 and the second compensation capacitor Cc2, based on the double feed-forward current 2Iff.

During a second transition period TP2 between the time point t3 and a time point t4, through the feed-forward current Iff and the compensation current Icc, the amount of accumulated charge of the first compensation capacitor Cc1 and the second compensation capacitor Cc2 may vary as much as the compensation amount of charge Qcc that is the same as the feed-forward amount of charge Qff. Through the amount of change in the amount of accumulated charge of the first compensation capacitor Cc1 and the second compensation capacitor Cc2, during the second transition period TP2, the k-th output voltage VOUT_k may increase by the second voltage gap ΔV2 from the third voltage V3 to the fourth voltage V4.

As a result, through the feed-forward current Iff and the compensation current Icc described above, the k-th source amplifier SAMPka may minimize the consumption current Iw flowing from the second and fourth nodes N2 and N4 to the first compensation capacitor Cc1 and the second compensation capacitor Cc2, and may increase the magnitude of the first intermediate current Ic1 and the second intermediate current Ic2, which are driving signal. The increased first intermediate currents Ic1 and the increased second intermediate current Ic2 may reduce the time interval of the second transition period TP2, and the slew rate for the k-th output voltage VOUT_k may be accelerated.

FIG. 11 illustrates a source amplifier according to an embodiment. The k-th source amplifier SAMPkb of FIG. 11 may correspond to the k-th source amplifier SAMPka of FIG. 4, and hereinafter, the k-th source amplifier SAMPkb will be described focusing on the difference from the k-th source amplifier SAMPka of FIG. 4.

Referring to FIG. 11, a feed-forward unit FFU' may correspond to the feed-forward unit FFU of FIG. 4, and the feed-forward unit FFU' may include a k_1-th feed-forward capacitor Cffk1' corresponding to the first compensation capacitor Cc1, a first N-fold current mirror CMN_1 disposed between the k_1-th feed-forward capacitor Cffk1' and the first intermediate node CNd1, a k_2-th feed-forward capacitor Cffk2' disposed between the second intermediate node CNd2 and the input terminal and corresponding to the second compensation capacitor Cc2, and a second N-fold current mirror CMN_2 disposed between the k_2-th feed-forward capacitor Cffk2' and the second intermediate node CNd2.

The capacitance of each of the k_1-th and k_2-th feed-forward capacitors Cffk1' and Cffk2' may be 1/N times of the capacitance of the first compensation capacitor Cc1 and the second compensation capacitor Cc2. In the present disclosure below, N is an integer greater than 1.

In an embodiment, the applied voltage of the k_1-th and k_2-th feed-forward capacitors Cffk1' and Cffk2' in the compensation period and the applied voltage of the first compensation capacitor Cc1 and the second compensation capacitor Cc2 in the compensation period may be the same.

As the first input voltage Vip varies in the transition period, a 1/N-fold feed-forward current Iff/N may be generated in the k_1-th and k_2-th feed-forward capacitors Cffk1' and Cffk2', in response to the compensation current Icc. The 1/N-fold feed-forward current Iff/N may be 1/N times of the feed-forward current Iff.

In an embodiment, a current ratio of each of the first N-fold current mirror CMN_1 and the second N-fold current mirror CMN_2 may be one (1) to N. In the transition period, each of the first N-fold current mirror CMN_1 and the second N-fold current mirror CMN_2 may amplify the 1/N-fold feed-forward current Iff/N by N times to generate the feed-forward current Iff. In an embodiment, the magnitude of the feed-forward current Iff and the magnitude of the compensation current Icc may be the same.

While the first N-fold current mirror CMN_1 and the second N-fold current mirror CMN_2 perform the current mirroring operation, the magnitude of the feed-forward current Iff and the magnitude of the compensation current Icc are equal, so that the consumption current Iw provided from the input unit IU to the first compensation capacitor Cc1 and the second compensation capacitor Cc2 may be minimized. In an embodiment, while the first N-fold current mirror CMN_1 and the second N-fold current mirror CMN_2 perform the current mirroring operation, the consumption current Iw may be 0.

During at least a part of the transition period, the magnitude of the feed-forward current Iff and the magnitude of the compensation current Icc are the same, and the consumption current Iw provided from the input unit IU to the first compensation capacitor Cc1 and the second compensation capacitor Cc2 may be blocked. According to the blocking of the consumption current Iw, the magnitude of the first intermediate current Ic1 and the second intermediate current Ic2 may increase, and by the increase of the first intermediate current Ic1 and the second intermediate current Ic2, the output of the amplifier unit AU increases, and the performance of the output unit OU may be improved, so that the slew rate for the k-th output voltage VOUT_k may be accelerated.

In an embodiment, during the entire transition period, the feed-forward unit FFU' may input and output the feed-forward amount of charge Qff through the feed-forward current Iff, and the amount of accumulated charge of the first compensation capacitor Cc1 and the second compensation capacitor Cc2 may also vary as much as the compensation amount of charge Qcc that is the same as the feed-forward amount of charge Qff. That is, the consumption current Iw may be blocked in the entire period of the transition period, the output of the amplifier unit AU increases in the entire period of the transition period, and the performance of the output unit OU may be improved, so that the slew rate for the k-th output voltage VOUT_k may be accelerated.

Through the compensator unit CU and the feed-forward unit FFU', the k-th source amplifier SAMPkb may improve the performance of operation speed for the k-th output voltage VOUT_k while improving the frequency characteristics.

In an embodiment, through the first N-fold current mirror CMN_1 and the second N-fold current mirror CMN_2, the k-th source amplifier SAMPkb may not only improve the performance, but also reduce the magnitude of k_1-th and the k_2-th feed-forward capacitors Cffk1' and Cffk2' connected to the input terminal by 1/N times. The k-th source amplifier SAMPkb may improve the input delay due to the RC delay with respect to the first input voltage Vip, through the first N-fold current mirror CMN_1 and the second N-fold current mirror CMN_2.

In an embodiment, the feed-forward unit FFU' may include each of the first N-fold current mirror CMN_1 and the second N-fold current mirror CMN_2 separated from the current mirror in the amplifier unit AU, and the feed-forward unit FFU' and the amplifier unit AU may not share the current mirror.

Figure 12:
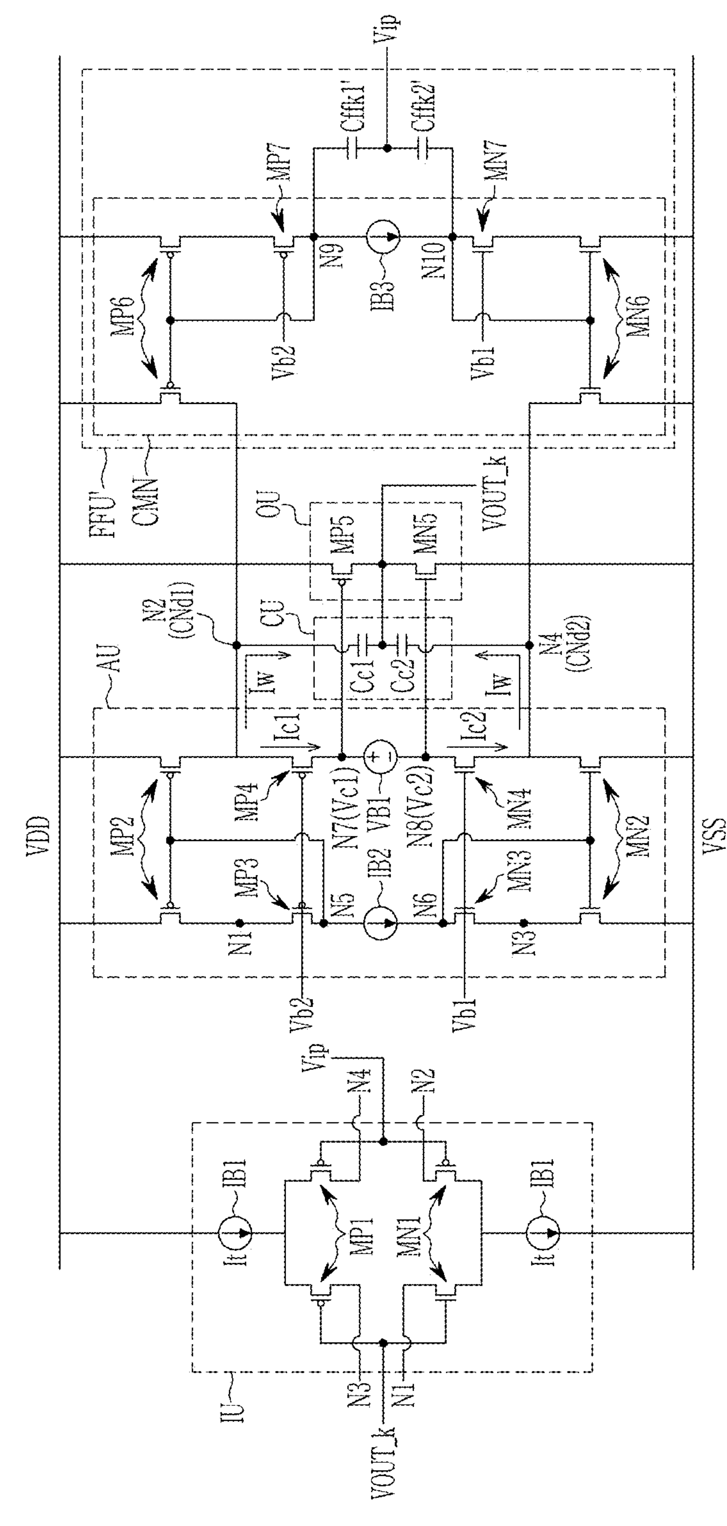
FIG. 12 illustrates a source amplifier according to an embodiment.

FIG. 12 illustrates a source amplifier according to an embodiment. Specifically, FIG. 12 is an exemplary circuit diagram for the k-th source amplifier SAMPkb of FIG. 11. A circuit diagram of the k-th source amplifier SAMPkb of FIG. 12 may correspond to a circuit diagram for the k-th source amplifier SAMPka of FIG. 5. Hereinafter, a circuit diagram for the k-th source amplifier SAMPkb of FIG. 11 will be described focusing on the difference from a circuit diagram for the k-th source amplifier SAMPka of FIG. 5.

Referring to FIG. 11 and FIG. 12, the k-th source amplifier SAMPkb may include the first tail current source IB1, the first differential transistor pair MN1, the second differential transistor pair MP1, the first current mirror MP2, the first bias circuits MP3 and MP4, the second current mirror MN2, the second bias circuits MN3 and MN4, the bias constant current source IB2, the bias constant voltage source VB1, the output buffers MP5 and MN5, the pair of compensation capacitors Cc1 and Cc2, and the k-th pair of feed-forward capacitors Cffk1' and Cffk2'. In an embodiment, the k-th source amplifier SAMPkb may further include a third current mirror MP6, a third bias circuit MP7, a fourth current mirror MN6, a fourth bias circuit MN7, and an additional bias constant current source IB3, additionally in comparison with the k-th source amplifier SAMPka of FIG. 4 and FIG. 5.

The third current mirror MP6, the third bias circuit MP7, the fourth current mirror MN6, the fourth bias circuit MN7, and the additional bias constant current source IB3 may be driven as the N-fold current mirror CMN in the feed-forward unit FFU'.

The third current mirror MP6 may be disposed between the first power source voltage line and (a set of) a second node N2 and a ninth node N9. The third bias circuit MP7 may be disposed between the third current mirror MP6 and a ninth node N9. In an embodiment, a current ratio of the third current mirror MP6 may be 1 to N, and the disclosure is not limited thereto.

The third bias circuit MP7 may provide a bias voltage for the third current mirror MP6 to perform the current mirroring operation.

The fourth current mirror MN6 may be disposed between the second power source voltage line and fourth and a tenth node (N4, N10), and the fourth bias circuit MN7 may be disposed between the fourth current mirror MN6 and a tenth node N10. In an embodiment, a current ratio of the second current mirror MN2 may be 1 to N, and the disclosure is not limited thereto.

The fourth bias circuit MN7 may provide a bias voltage for the fourth current mirror MN6 to perform the current mirroring operation.

The additional bias constant current source IB3 may be connected between the ninth node N9 and the tenth node N10, and the bias constant voltage source VB1 may be connected between the seventh node N7 and the eighth node N8.

The k-th pair of feed-forward capacitors Cffk1' and Cffk2' may be driven as the feed-forward unit FFU' together with the third current mirror MP6 and the fourth current mirror MN6. Each of the third current mirror MP6 and the fourth current mirror MN6 may be driven as each of the first N-fold current mirror CMN_1 and the second N-fold current mirror CMN_2 of the feed-forward unit FFU'.

The k_1-th feed-forward capacitor Cffk1' may be connected between the input terminal and the ninth node N9, and the k_2-th feed-forward capacitor Cffk2' may be connected between the input terminal and the tenth node N10.

Each of the k_1-th feed-forward capacitor Cffk1' and the k_2-th feed-forward capacitor Cffk2' may correspond to each of the first compensation capacitor Cc1 and the second compensation capacitor Cc2. In an embodiment, the capacitance of the k_1-th feed-forward capacitor Cffk1' may be 1/N times of the capacitance of the first compensation capacitor Cc1, and the capacitance of the k_2-th feed-forward capacitor Cffk2' may be 1/N times of the capacitance of the second compensation capacitor Cc2, but may vary depending on the design purpose.

In an embodiment, an amount of change in the amount of accumulated charge of the k_1-th and k_2-th feed-forward capacitors Cffk1' and Cffk2' during the transition period of the k-th source amplifier SAMPkb may be 1/N times of the amount of change in the amount of accumulated charge of the first compensation capacitor Cc1 and the second compensation capacitor Cc2 in the transition period, and may vary depending on the embodiment. In an embodiment, during the transition period of the k-th source amplifier SAMPkb, the amount of charge input to and output from the feed-forward unit FFU' may be the same as the amount of change in the amount of accumulated charge of the first compensation capacitor Cc1 and the second compensation capacitor Cc2 in the transition period. In an embodiment, the applied voltage of the k_1-th and k_2-th feed-forward capacitors Cffk1' and Cffk2' in the compensation period and the applied voltage of the first compensation capacitor Cc1 and the second compensation capacitor Cc2 in the compensation period may be the same.

Figure 14:
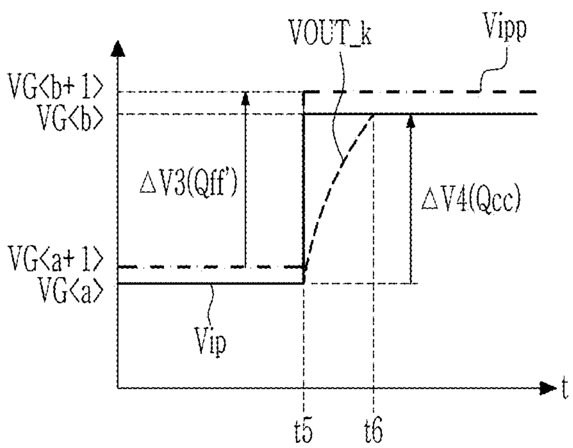
FIG. 14 illustrates a source amplifier according to an embodiment.

FIG. 13 illustrates the source amplifier according to an embodiment. FIG. 14 illustrates the source amplifier according to an embodiment. A k-th source amplifier SAMPkc of FIG. 13 may correspond to the k-th source amplifier SAMPka of FIG. 4, and hereinafter, the k-th source amplifier SAMPkc will be described focusing on the difference from the k-th source amplifier SAMPka of FIG. 4.

Referring to FIG. 13 and FIG. 14, the k-th source amplifier SAMPkc may include the input terminal to which the first input voltage Vip is applied and the adjacent input terminal to which an adjacent input voltage Vipp is applied. The k-th source amplifier SAMPkc may receive the gamma voltage VG as the first input voltage Vip, and may receive the adjacent gamma voltage VGa adjacent to the gamma voltage VG as the adjacent input voltage Vipp.

In the present disclosure, the adjacent gamma voltage VGa may have predetermined step difference with respect to the gamma voltage VG. As an example, when the adjacent gamma voltage VGa is a voltage that is one step greater than the gamma voltage VG, when the gamma voltage VG is a tenth gamma voltage VG<10>, the adjacent gamma voltage VGa may be an eleventh gamma voltage VG<11>. The input terminal and the adjacent input terminal of the k-th source amplifier SAMPkc may be electrically connected to adjacent gamma lines through a source decoder corresponding to the same source channel.

The feed-forward unit FFU may be disposed between the adjacent input terminal and (a set of) the first intermediate node CNd1 and the second intermediate node CNd2, and the k_1-th feed-forward capacitor Cffk1 of the feed-forward unit FFU may be disposed between the adjacent input terminal and the first equivalent current mirror CM1_1, and the k_2-th feed-forward capacitor Cffk2 of the feed-forward unit FFU may be disposed between the adjacent input terminal and the second equivalent current mirror CM1_2.

As the input voltage Vip and the adjacent input voltage Vipp vary in the transition period, the feed-forward current Iff may be generated in the k_1-th and k_2-th feed-forward capacitors Cffk1 and Cffk2, in response to the compensation current Icc.

During the transition period, the amount of accumulated charge of the k_1-th and k_2-th feed-forward capacitors Cffk1 and Cffk2 may vary by a feed-forward amount of charge Qff' by the feed-forward current Iff. The amount of change of the adjacent input voltage Vipp in the transition period may correspond to the amount of change of the k-th output voltage VOUT_k, and the feed-forward amount of charge Qff' and the compensation amount of charge Qcc may correspond to each other.

In an example of FIG. 14, in the compensation period, which may be before a time point t5 and before the first input voltage Vip is varied, the first input voltage Vip and the k-th output voltage VOUT_k of the k-th source amplifier SAMPka may be constantly maintained at an a-th gamma voltage VG<a>, and the adjacent input voltage Vipp may be maintained at a (a+1)-th gamma voltage VG<a+1>.

At the time point t5, the first input voltage Vip may be varied from the a-th gamma voltage VG<a> to a b-th voltage VG<b>, and accordingly, the adjacent input voltage Vipp may increase from the (a+1)-th gamma voltage VG<a+1> to a (b+1)-th voltage VG<b+1> by the third voltage gap ΔV3.

In response to (or based on) the varying of the adjacent input voltage Vipp, the feed-forward current Iff corresponding to the compensation current Icc may flow from each of the k_1-th and k_2-th feed-forward capacitors Cffk1 and Cffk2. In response to (or based on) the varying of the adjacent input voltage Vipp, the first equivalent current mirror CM1_1 and the second equivalent current mirror CM1_2 may match the feed-forward current Iff and the compensation current Icc flowing to the first compensation capacitor Cc1 and the second compensation capacitor Cc2 through the current mirroring operation. Based on the feed-forward current Iff and the compensation current Icc, the amount of accumulated charge of the k_1-th and k_2-th feed-forward capacitors Cffk1 and Cffk2 is varied by the feed-forward amount of charge Qff', and the amount of accumulated charge of the first compensation capacitor Cc1 and the second compensation capacitor Cc2 may be varied as much as the compensation amount of charge Qcc corresponding to the feed-forward amount of charge Qff'.

Between the time point t5 and a time point t6, according to the varying of the amount of accumulated charge of the first compensation capacitor Cc1 and the second compensation capacitor Cc2, the k-th output voltage VOUT_k may be varied from the a-th gamma voltage VG<a> to the b-th voltage VG<b>.

While the amount of accumulated charge of the k_1-th and k_2-th feed-forward capacitors Cffk1 and Cffk2 vary as much as the feed-forward amount of charge Qff' in the transition period, the first equivalent current mirror CM1_1 and the second equivalent current mirror CM1_2 may perform the current mirroring operation so that the amount of accumulated charge of the first compensation capacitor Cc1 and the second compensation capacitor Cc2 may be varied. That is, the consumption current Iw may be blocked in at least a portion of the transition period, the output of the amplifier unit AU increases in at least a portion of the transition period, and the performance of the output unit OU may be improved, so that the slew rate for the k-th output voltage VOUT_k may be accelerated.

Through the compensator unit CU and the feed-forward unit FFU, the k-th source amplifier SAMPkc may improve the performance of operation speed for the k-th output voltage VOUT_k while improving the frequency characteristics.

Through the k_1-th and k_2-th feed-forward capacitors Cffk1 and Cffk2 connected to the adjacent input terminal, the k-th source amplifier SAMPkc may improve the above-described performance, and may reduce the magnitude of the capacitor connected to the input terminal. Through separation of the input terminal and the adjacent input terminal, the k-th source amplifier SAMPkc may not only improve the input delay due to the RC delay with respect to the first input voltage Vip but also improve the frequency characteristic and operation performance.

FIG. 14 illustrates that the adjacent input voltage Vipp is one step higher than the first input voltage Vip, however, depending on the embodiment, the step difference between the adjacent input voltage Vipp and the first input voltage Vip may vary. In an embodiment, the adjacent input voltage Vipp may be lower than the first input voltage Vip by a predetermined step. As an example, when the first input voltage Vip is the a-th gamma voltage VG<a>, the adjacent input voltage Vipp may be a (a−1)-th gamma voltage that is lower than the first input voltage Vip by one step.

Figure 15:
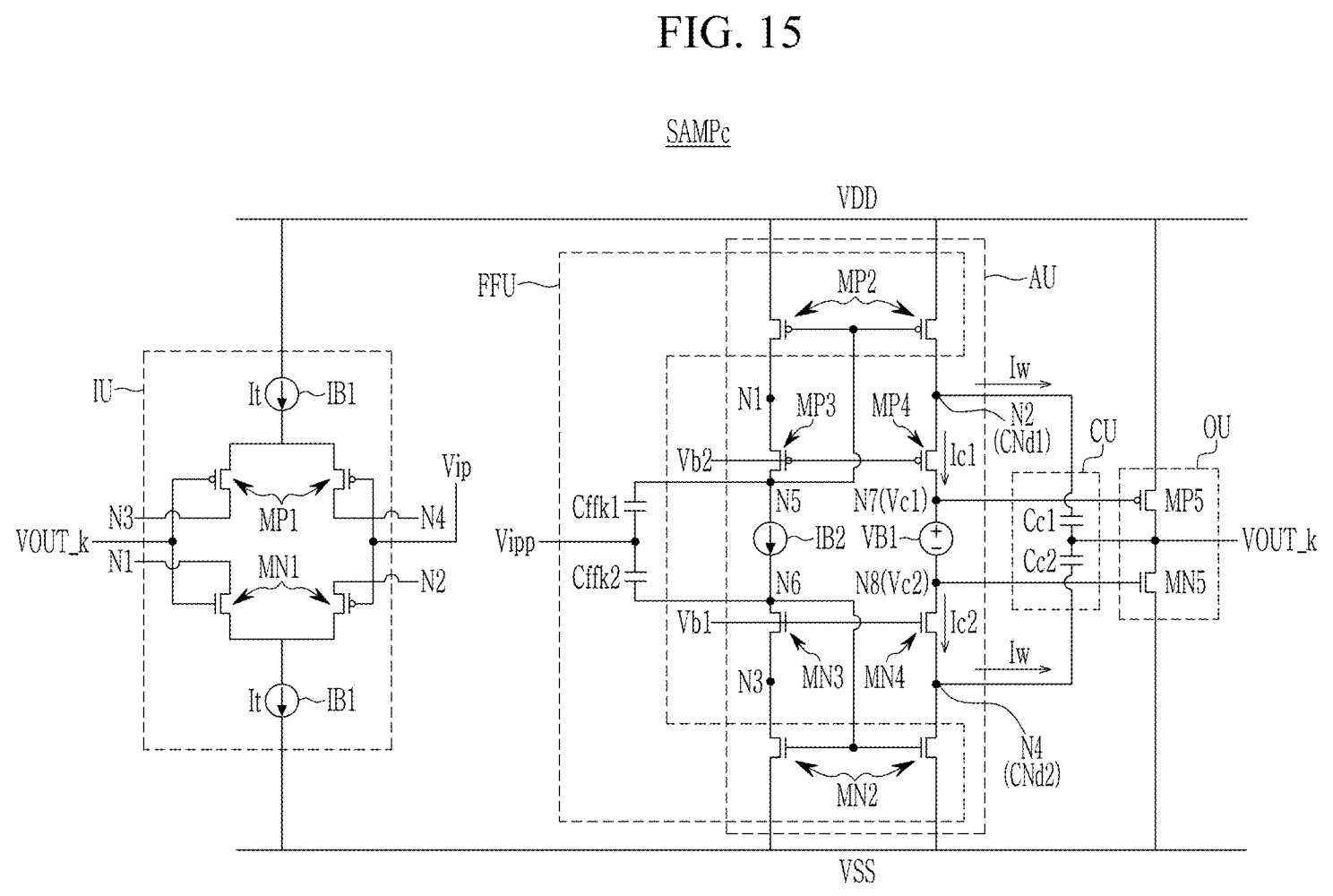

FIG. 15 illustrates a source amplifier according to an embodiment. Specifically, FIG. 15 is an exemplary circuit diagram for the k-th source amplifier SAMPkc of FIG. 13.

A circuit diagram of the k-th source amplifier SAMPkc of FIG. 15 may correspond to a circuit diagram for the k-th source amplifier SAMPka of FIG. 5. Hereinafter, a circuit diagram for the k-th source amplifier SAMPkc of FIG. 13 will be described focusing on the difference from a circuit diagram for the k-th source amplifier SAMPka of FIG. 5.

Referring to FIG. 13 and FIG. 15, the k_1-th feed-forward capacitor Cffk1 may be connected between the adjacent input terminal and the fifth node N5, and the k_2-th feed-forward capacitor Cffk2 may be connected between the adjacent input terminal and the sixth node N6.

Figure 16:
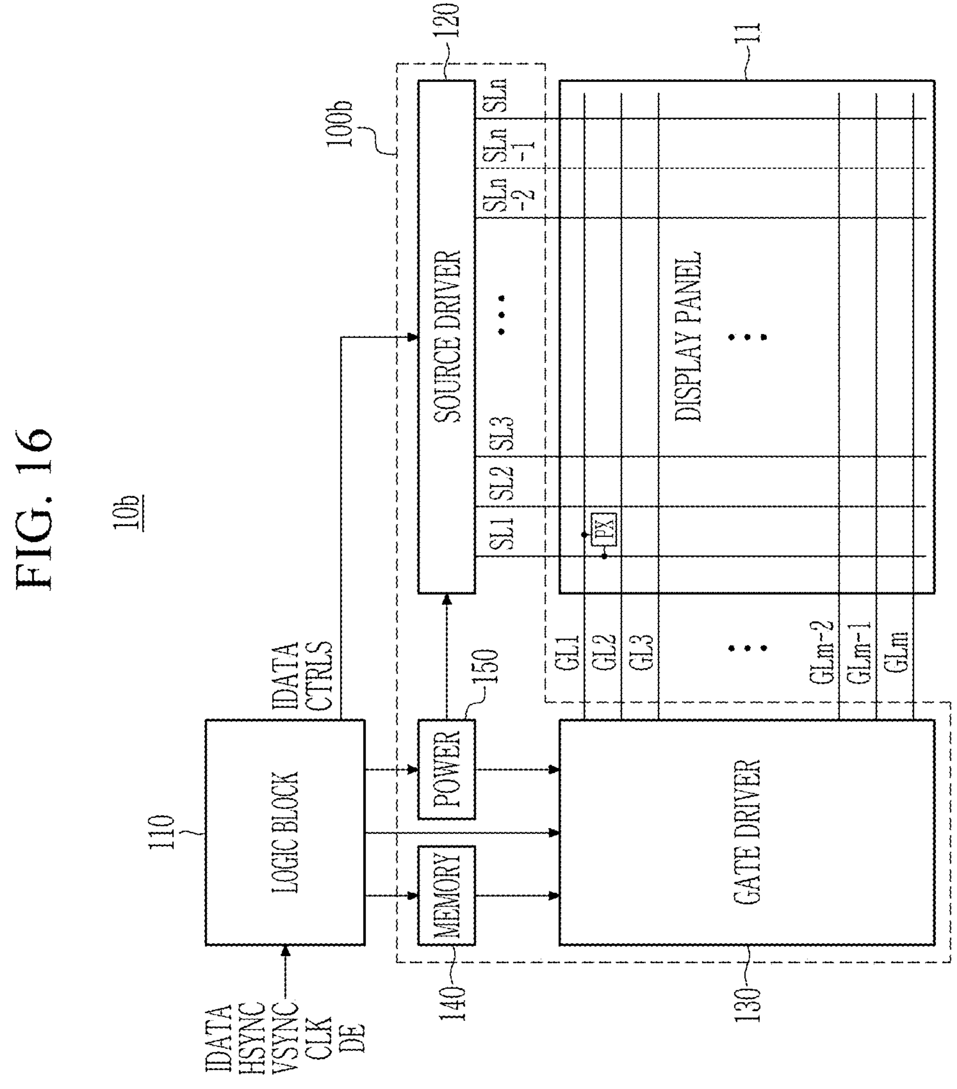
FIG. 16 illustrates a display device according to an embodiment.

FIG. 16 illustrates a display device according to an embodiment. A display device 10*b* of FIG. 16 may correspond to the display device 10*a* of FIG. 1. To avoid repeated descriptions and provide easy descriptions, a detailed description on the display device 10*b* will focus on differences from the display device 10*a* of FIG. 1.

The display device 10*b* may be included in large electronic products such as TVs or monitors, but the disclosure is not limited thereto.

The display device 10*b* may include a display driver IC 100*b*, the logic block 110 and the display panel 11. Each of the display driver IC 100*b*, the logic block 110, and the display panel 11 may correspond to the display driver IC 100*a*, the logic block 110 and the display panel 11 of FIG. 1.

According to an embodiment, the logic block 110 may not be included in the display driver IC 100*b* but may be realized as an individual chip or device. The source driver 120 may receive the image data IDATA and the plurality of control signals CTRLS from the externally disposed logic block 110.

As described with reference to FIG. 1 to FIG. 15, the source driver 120 may include the source amplifier including the compensation capacitor and the feed-forward capacitor, and thereby not only improve the frequency characteristics but also improve the performance of the buffer operation speed.

Figure 17:
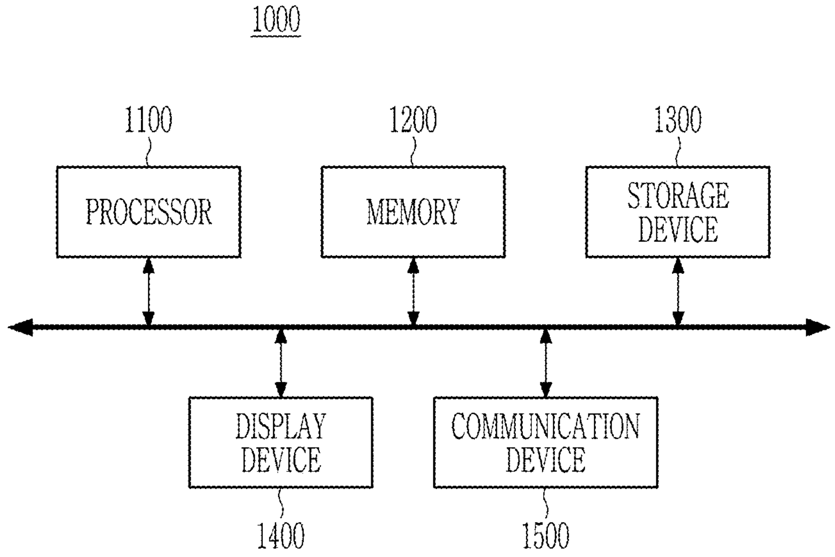
FIG. 17 illustrates an electronic device according to an embodiment.

FIG. 17 illustrates the electronic device according to an embodiment. Referring to FIG. 10, an electronic device 1000 may include a processor 1100, a memory 1200, a storage device 1300, a display device 1400, and a communication device 1500. The processor 1100, the memory 1200, the storage device 1300, the display device 1400, and the communication device 1500 may perform data communication with each other through an internal bus.

The processor 1100 may control an overall operation of the electronic device 1000. The processor 1100 may perform operations to execute various software, firmware, or program codes loaded into the memory 1200. The processor 1100 may function as a central processing unit of the electronic device 1000. The processor 1100 may include one or more the processor cores.

The memory 1200 may store data and program codes processed or to be processed by the processor 1100. For example, software, firmware, program codes, or instructions to be executed by the processor 1100 may be loaded into the memory 1200. The memory 1200 may function as a main memory device of the electronic device 1000. The memory 1200 may include a dynamic random-access memory (DRAM), a static random-access memory (SRAM), a phase-change random-access memory (PRAM), a magnetic random-access memory (MRAM), a ferroelectric random-access memory (FeRAM), a resistive random-access memory (RRAM), or the like. The memory 1200 may also be referred to as a buffer memory, a cache memory, or the like. Unlike what is shown, the number of the memory 1200 may be one or more. Unlike what is shown, the memory 1200 may be implemented as an external device capable of communicating with the electronic device 1000.

The storage device 1300 may store data generated by the processor 1100 for the purpose of a long-term storage, files to be driven by the processor 1100, or various types of software, firmware, program codes, or instructions executable by the processor 1100. The storage device 1300 may function as an auxiliary memory device of the electronic device 1000. The storage device 1300 may include a NAND flash memory, a NOR flash memory, or the like. Unlike what is shown, the number of the storage device 1300 may be one or more. Unlike what is shown, the storage device 1300 may be implemented as an external device capable of communicating with the electronic device 1000.

Under the control of the processor 1100, the display device 1400 may provide an image to a user. For example, as described with reference to FIG. 1 to FIG. 15, the source driver in the display device 1400 may include the source amplifier including the compensation capacitor and the feed-forward capacitor. Through the compensation capacitor and the feed-forward capacitor, the source driver may improve the performance of the buffer operation speed while improving the frequency characteristics.

The communication device 1500 may communicate with an external device of the electronic device 1000 based on various wired/wireless rules. For example, under the control of the processor 1100, a communication device 1500 may receive data from an external device, or transmit data stored in the memory 1200 or the storage device 1300 to an external device. In an embodiment, the communication device 1500 may include a user interface to receive data from the user of the electronic device 1000 or to output data to the user.

While this disclosure is described in connection with what is presently considered to be practical embodiments, the disclosure is not limited to the disclosed embodiments. The disclosure covers various modifications and equivalent arrangements included within the spirit and scope of the appended claims.

What is claimed is:

1. A source amplifier comprising:

an input circuit configured to:

receive an input signal from an input terminal and an output signal having a complementary relationship with the input signal, and output a first intermediate signal and a second intermediate signal, respectively, to a first intermediate node and a second intermediate node, based on the input signal and the output signal;

an amplifier configured to amplify the first intermediate signal and the second intermediate signal, to output a third intermediate signal and a fourth intermediate signal;

an output circuit configured to output the output signal, which is a data voltage, to an output terminal, based on the third intermediate signal and the fourth intermediate signal;

a compensator comprising:

a first capacitor connected between the output terminal and the first intermediate node, and a second capacitor connected between the output terminal and the second intermediate node; and a feed-forward circuit comprising:

a third capacitor connected to the first intermediate node and corresponding to the first capacitor, and a fourth capacitor connected to the second intermediate node and corresponding to the second capacitor.

2. The source amplifier of claim 1, wherein the amplifier comprises:

a first current mirror configured to receive a third current flowing from the third capacitor and perform a current mirroring operation;

a second current mirror configured to receive a fourth current flowing from the fourth capacitor and perform the current mirroring operation; and wherein the feed-forward circuit and the amplifier are configured to share the first current mirror and the second current mirror.

3. The source amplifier of claim 2, wherein a current ratio for the first current mirror and the second current mirror is one (1) to one (1).

4. The source amplifier of claim 2, wherein a first capacitance of the first capacitor is substantially similar to or is equal to a third capacitance of the third capacitor.

5. The source amplifier of claim 4, wherein the third capacitor is between the input terminal and the first intermediate node, and wherein the fourth capacitor is between the input terminal and the second intermediate node.

6. The source amplifier of claim 4, wherein the third capacitor and the fourth capacitor are connected to an adjacent input terminal that is different from the input terminal, wherein the input terminal is connected to a first gamma line through a decoder, and wherein the adjacent input terminal is connected to a second gamma line adjacent from the first gamma line through the decoder.

7. The source amplifier of claim 1, wherein the feed-forward circuit further comprises an N-fold current mirror separated from the amplifier and configured to perform a current mirroring operation between a first set of the third capacitor and the fourth capacitor and a second set of the first intermediate node and the second intermediate node.

8. The source amplifier of claim 7, wherein a current ratio of the N-fold current mirror is one (1) to N, where N is a real number greater than one (1), and wherein a ratio of a first capacitance of the first capacitor and a third capacitance of the third capacitor is N to one (1).

9. The source amplifier of claim 1, wherein a first voltage level of the input signal is substantially similar to or is equal to a second voltage level of the output signal in a compensation period.

10. The source amplifier of claim 9, wherein, in a transition period in which the output signal is varied, a first amount of charge varied in the first capacitor is substantially similar to or is equal to a second amount of charge varied in the third capacitor.

11. A source amplifier comprising:

a first differential transistor pair of first conductivity type that is configured to operate based on an input signal and an output signal having a complementary relationship with the input signal, and that is connected to a first node and a second node;

a second differential transistor pair of second conductivity type that is configured to operate based on the input signal and the output signal, and that is connected to a third node and a fourth node;

a first current mirror connected between a first set of the first node and the second node and a first power source voltage line;

a first bias circuit connected between the first set of the first node and the second node and a second set of a fifth node and a sixth node;

a second current mirror connected between a third set of the third and the fourth node and a second power source voltage line;

a second bias circuit connected between the third set of the third and the fourth node and a fourth set of a seventh node and an eighth node;

an output buffer configured to buffer an amplified voltage based on a sixth voltage of the sixth node and an eighth voltage of the eighth node to an output terminal;

a first capacitor connected between the output terminal and the second node;

a second capacitor connected between the output terminal and the fourth node;

a third capacitor connected to the second node and corresponding to the first capacitor; and a fourth capacitor connected to the fourth node and corresponding to the second capacitor.

12. The source amplifier of claim 11, wherein, during a transition period, a first amount of accumulated charge of the first capacitor is varied by a first amount of charge, and a third amount of accumulated charge of the third capacitor is varied by the first amount of charge.

13. The source amplifier of claim 12, wherein, in the transition period, a first current flowing from the first capacitor is substantially similar to or is equal to a third current flowing from the third capacitor.

14. The source amplifier of claim 13, further comprising:

a first current source configured to provide a tail current to the first differential transistor pair; and a second current source configured to provide the tail current to the second differential transistor pair, wherein, in the transition period, a consumption current flowing to the third capacitor and the fourth capacitor is blocked based on the tail current.

15. The source amplifier of claim 11, wherein:

the first differential transistor pair and the second differential transistor pair are configured to receive the output signal from the output terminal.

16. The source amplifier of claim 11, wherein a current ratio for the first current mirror and the second current mirror is one (1) to one (1).

17. A source driver comprising:

a gamma voltage generator comprising a plurality of gamma lines configured to provide a plurality of gamma voltages;

a decoder configured to select the plurality of gamma lines based on an image data; and a first source amplifier comprising:

a first input circuit configured to:

receive a first input signal provided through the decoder and a first input terminal and a first output signal having a complementary relationship with the first input signal, and output a first intermediate signal and a second intermediate signal to a first intermediate node and a second intermediate node, respectively, based on the first input signal and the first output signal, a first amplifier configured to output a third intermediate signal and a fourth intermediate signal by amplifying the first intermediate signal and the second intermediate signal, respectively, a first output circuit configured to output the first output signal, which is a first data voltage, to a first output terminal based on the third intermediate signal and the fourth intermediate signal, a first compensator comprising:

a first capacitor connected between the first output terminal and the first intermediate node, and a second capacitor connected between the first output terminal and the second intermediate node, and a first feed-forward circuit comprising:

a third capacitor connected to the first intermediate node and corresponding to the first capacitor, and a fourth capacitor connected to the second intermediate node and corresponding to the second capacitor.

18. The source driver of claim 17, further comprising:

a second source amplifier comprising:

a second input circuit configured to:

receive a second input signal provided through the decoder and a second input terminal, and a second output signal having the complementary relationship with the second input signal, and output a fifth intermediate signal and a sixth intermediate signal to a third intermediate node and a fourth intermediate node, respectively, based on the second input signal and the second output signal, a second amplifier configured to output a seventh intermediate signal and an eighth intermediate signal by amplifying the fifth intermediate signal and the sixth intermediate signal, respectively, a second output circuit configured to output the second output signal, which is a second data voltage, to a second output terminal based on the seventh intermediate signal and the eighth intermediate signal, a compensator comprising:

a fifth capacitor connected between the second output terminal and the third intermediate node, and a sixth capacitor connected between the second output terminal and the fourth intermediate node, and a second feed-forward circuit comprising:

a seventh capacitor electrically connected to the third intermediate node and corresponding to the fifth capacitor, and an eighth capacitor electrically connected to the fourth intermediate node and corresponding to the sixth capacitor, wherein the decoder comprises:

a first source decoder corresponding to the first source amplifier, and a second source decoder corresponding to the second source amplifier.

19. The source driver of claim 18, wherein a first distance between the gamma voltage generator and the first source decoder is greater than a second distance between the gamma voltage generator and the second source decoder; and wherein a seventh capacitance magnitude of the seventh capacitor is smaller than a third capacitance magnitude of the third capacitor.

20. The source driver of claim 17, wherein the first amplifier comprises a first current mirror connected to a first terminal of the third capacitor and configured to perform a current mirroring operation and a second current mirror connected to a first terminal of the fourth capacitor; and wherein the first feed-forward circuit and the first amplifier are configured to share the first current mirror and the second current mirror.

* * * * *